United States Patent
Heo et al.

(10) Patent No.: US 9,844,152 B2
(45) Date of Patent: Dec. 12, 2017

(54) DISPLAY DEVICE

(71) Applicant: LG ELECTRONICS INC., Seoul (KR)

(72) Inventors: Jinha Heo, Seoul (KR); Jihoon Han, Seoul (KR); Inkeun Ryu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 15 days.

(21) Appl. No.: 15/092,291

(22) Filed: Apr. 6, 2016

(65) Prior Publication Data

US 2017/0156219 A1  Jun. 1, 2017

(30) Foreign Application Priority Data

Nov. 27, 2015 (KR) .................. 10-2015-0167365
Dec. 23, 2015 (KR) .................. 10-2015-0185197

(51) Int. Cl.
  *H05K 5/00*  (2006.01)
  *H05K 5/03*  (2006.01)
  *H05K 1/02*  (2006.01)
  *G06F 1/16*  (2006.01)

(52) U.S. Cl.
  CPC .......... *H05K 5/0017* (2013.01); *G06F 1/1652* (2013.01); *G06F 1/1679* (2013.01); *H05K 1/028* (2013.01); *H05K 5/03* (2013.01)

(58) Field of Classification Search
  None
  See application file for complete search history.

(56) References Cited

U.S. PATENT DOCUMENTS

| | | | | |
|---|---|---|---|---|
| 2,055,862 A * | 9/1936 | Friedman | ............... | G03B 21/58 160/239 |
| 5,353,152 A * | 10/1994 | Realmuto | ............... | G03B 21/58 160/120 |
| 6,191,886 B1 * | 2/2001 | Sinkoff | ................... | G03B 21/58 160/24 |
| 6,762,929 B2 * | 7/2004 | Sawyer | ................. | G06F 1/1601 248/535 |
| 7,559,163 B2 * | 7/2009 | Ofuji | ....................... | G03B 21/58 160/265 |
| 8,516,728 B2 * | 8/2013 | Jung | ........................ | G09F 9/301 160/133 |

(Continued)

FOREIGN PATENT DOCUMENTS

| | | |
|---|---|---|
| EP | 3107082 A1 | 12/2016 |
| EP | 3115988 A1 | 1/2017 |

OTHER PUBLICATIONS

International Search Report, dated Aug. 25, 2016 for the PCT application No. PCT/KR2016/003601, 3 pages.

*Primary Examiner* — Charles A Fox
*Assistant Examiner* — Christopher E Veraa
(74) *Attorney, Agent, or Firm* — Dentons US LLP

(57) ABSTRACT

A display device includes a housing; at least one roller positioned within the housing; and a display portion including a display panel and a module cover, and the module cover is divided into a plurality of sections. The display panel and the module cover can transition from a first state where the display panel and the module cover are wound around the at least one roller to a second state where the display panel and the module cover are unwound from the at least one roller, in contact with each other, and exposed out of the housing.

16 Claims, 43 Drawing Sheets

(56) References Cited

U.S. PATENT DOCUMENTS

| | | | | |
|---|---|---|---|---|
| 8,526,109 | B1* | 9/2013 | Chen | G03B 21/58 359/461 |
| 8,654,519 | B2* | 2/2014 | Visser | G09F 9/00 361/679.21 |
| 8,953,327 | B1* | 2/2015 | Salmon | G06F 1/1652 160/242 |
| 9,316,899 | B2* | 4/2016 | Fast | G03B 21/58 |
| 9,337,434 | B2* | 5/2016 | Lindblad | H01L 51/52 |
| 2004/0183958 | A1* | 9/2004 | Akiyama | G09F 9/30 349/58 |
| 2004/0206462 | A1* | 10/2004 | Fitzgerald | E06B 9/115 160/231.1 |
| 2005/0040962 | A1 | 2/2005 | Funkhouser et al. | |
| 2006/0001820 | A1* | 1/2006 | Cheng | G02F 1/13452 349/150 |
| 2006/0038745 | A1* | 2/2006 | Naksen | G06F 1/1624 345/30 |
| 2006/0209406 | A1* | 9/2006 | Choi | G03B 21/58 359/461 |
| 2007/0241002 | A1* | 10/2007 | Wu | G06F 1/1601 206/150 |
| 2007/0273309 | A1* | 11/2007 | Carmen | E06B 9/40 318/16 |
| 2007/0285337 | A1* | 12/2007 | Maddock | G03B 21/58 345/1.1 |
| 2009/0302176 | A1* | 12/2009 | Kuroi | F16M 11/38 248/176.3 |
| 2011/0011542 | A1* | 1/2011 | Kuroi | G03B 21/58 160/133 |
| 2011/0043976 | A1 | 2/2011 | Visser et al. | |
| 2011/0132557 | A1* | 6/2011 | Kuroi | G03B 21/58 160/368.1 |
| 2011/0141559 | A1* | 6/2011 | Kuroi | G03B 21/58 359/461 |
| 2011/0199678 | A1* | 8/2011 | Kuroi | G03B 21/58 359/461 |
| 2012/0002357 | A1 | 1/2012 | Auld et al. | |
| 2012/0120480 | A1 | 5/2012 | Van Lieshout et al. | |
| 2012/0206801 | A1* | 8/2012 | Kuroi | G03B 21/58 359/461 |
| 2012/0291966 | A1* | 11/2012 | Kraeutler | E06B 9/13 160/127 |
| 2013/0058063 | A1* | 3/2013 | O'Brien | G06F 1/1624 361/807 |
| 2014/0099479 | A1* | 4/2014 | Krall | B32B 3/14 428/174 |
| 2014/0247544 | A1 | 9/2014 | Ryu | |
| 2014/0268532 | A1* | 9/2014 | Nicol | G09F 15/0062 361/679.26 |
| 2015/0029229 | A1 | 1/2015 | Voutsas | |
| 2015/0092353 | A1* | 4/2015 | Baik | H05K 1/028 361/720 |
| 2015/0195939 | A1* | 7/2015 | Muhr | H05K 5/04 29/432 |
| 2016/0100478 | A1* | 4/2016 | Lee | H04M 1/0202 361/749 |
| 2016/0296409 | A1* | 10/2016 | Schraudolph | A61H 3/04 |

* cited by examiner

FIG. 9
(a)
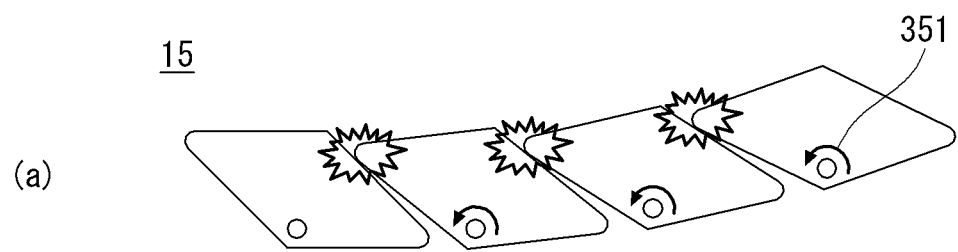
(b)
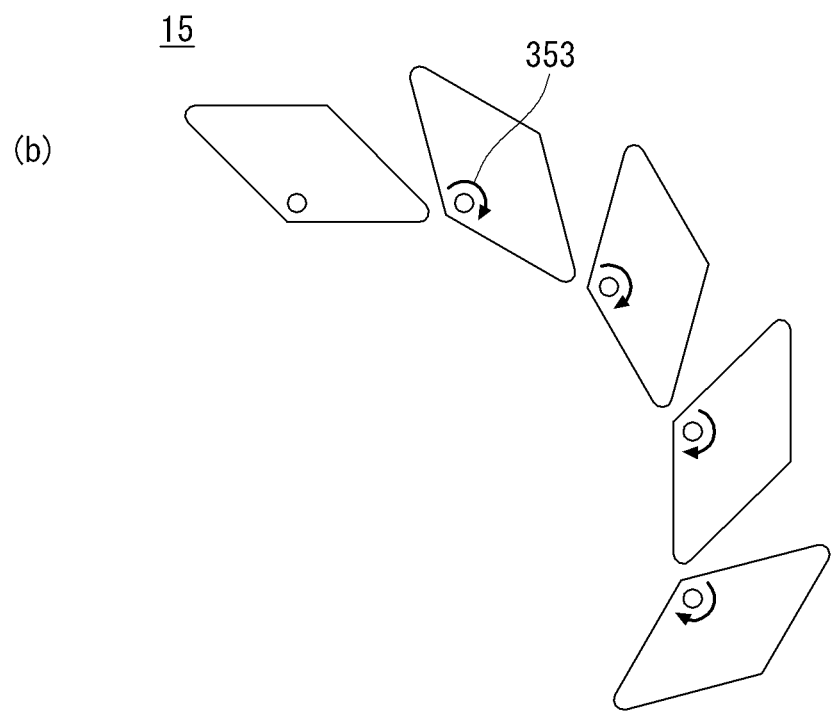

FIG. 13
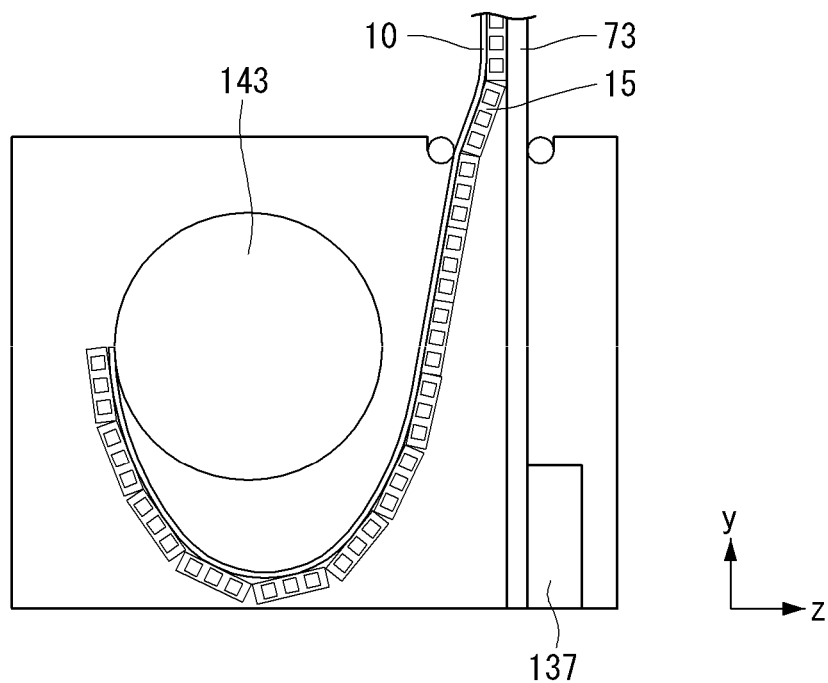
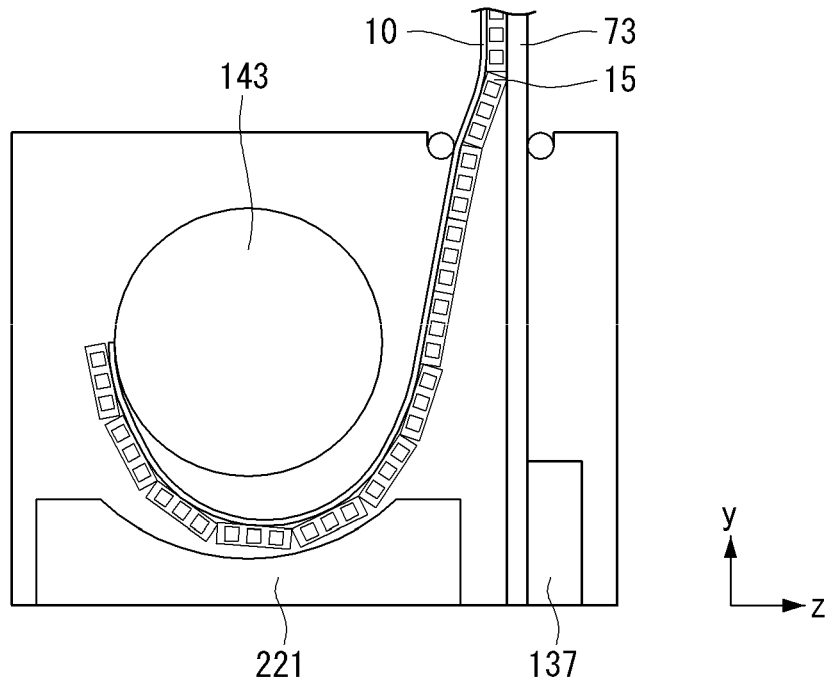

FIG. 17
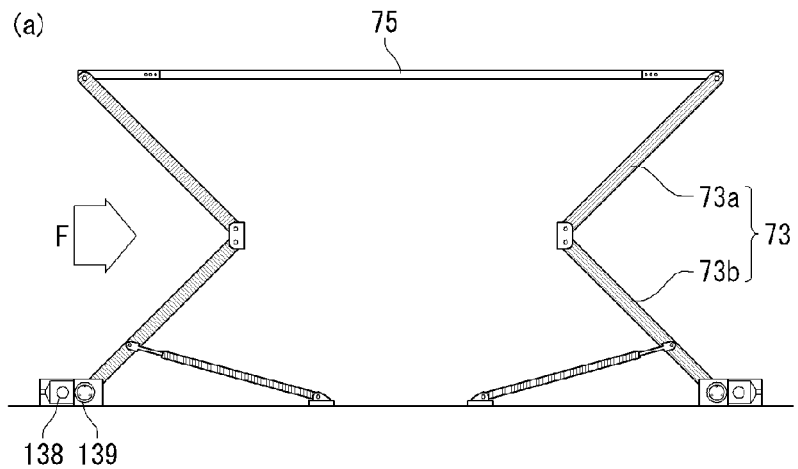
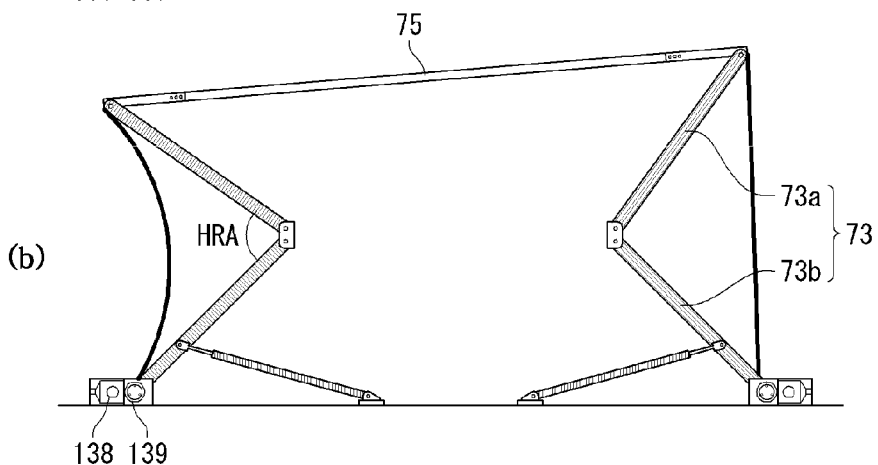
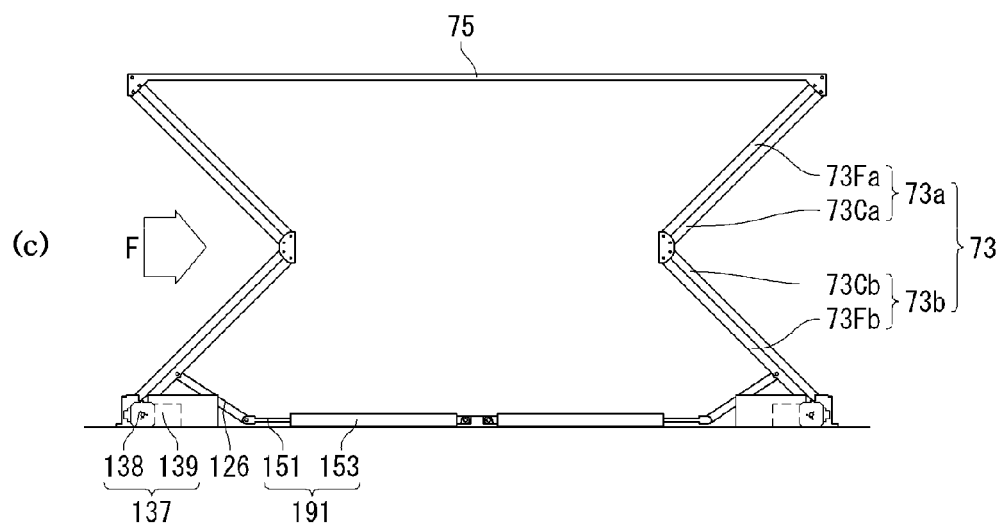

FIG. 19
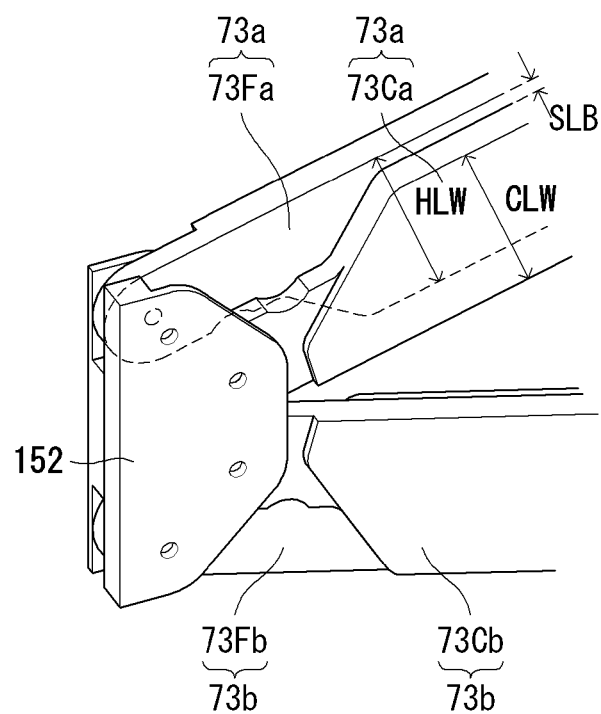
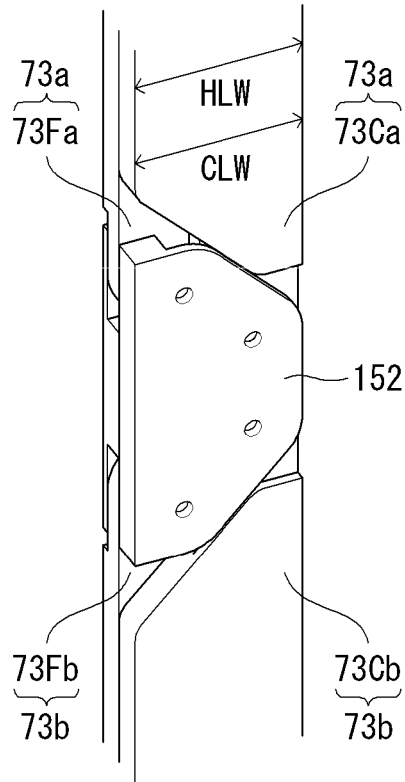

FIG. 20
(a)
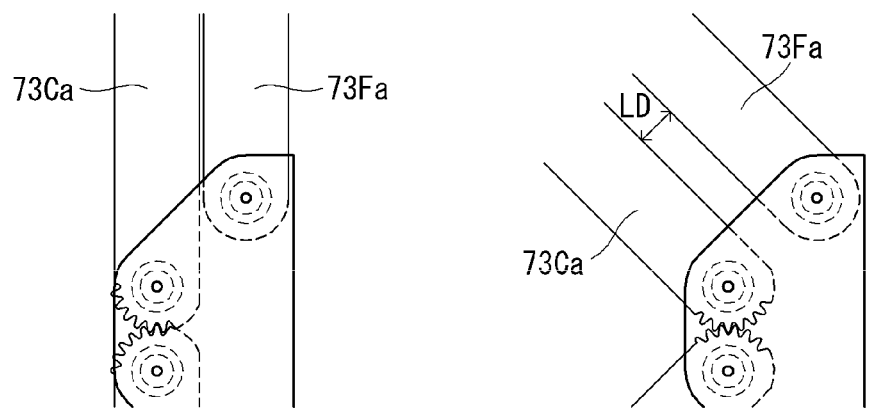
(b)
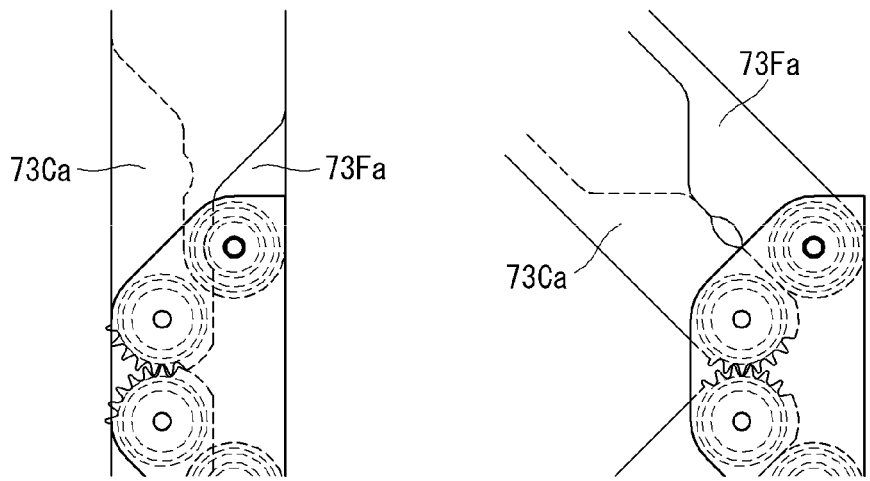

FIG. 29
(a)
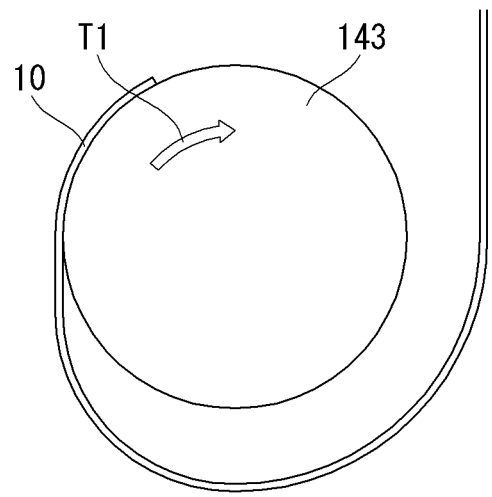
(b)
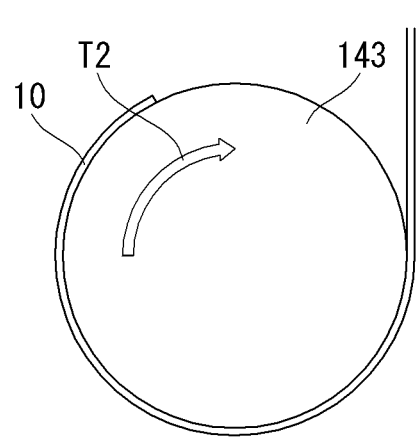

FIG. 30
(a)
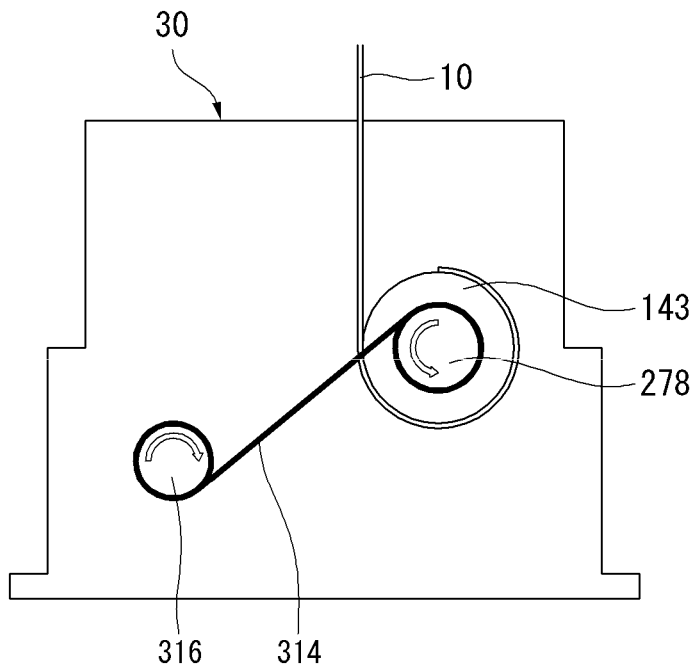
(b)
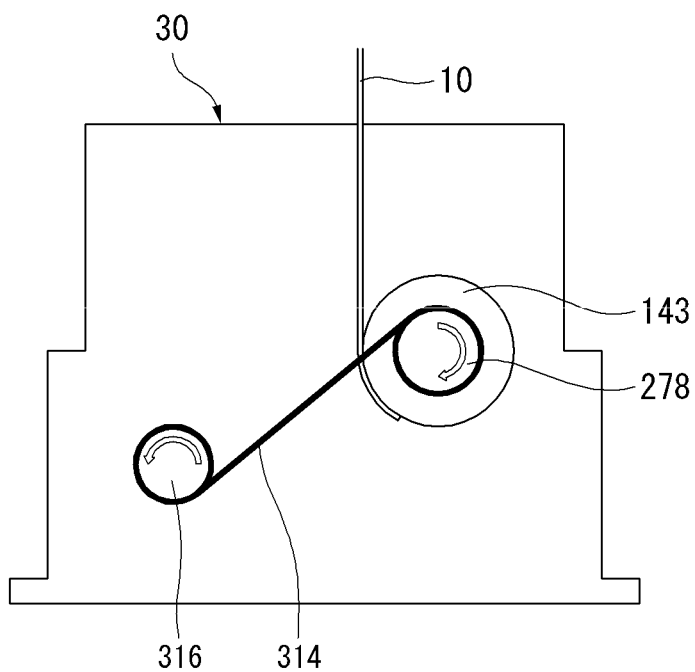

FIG. 36
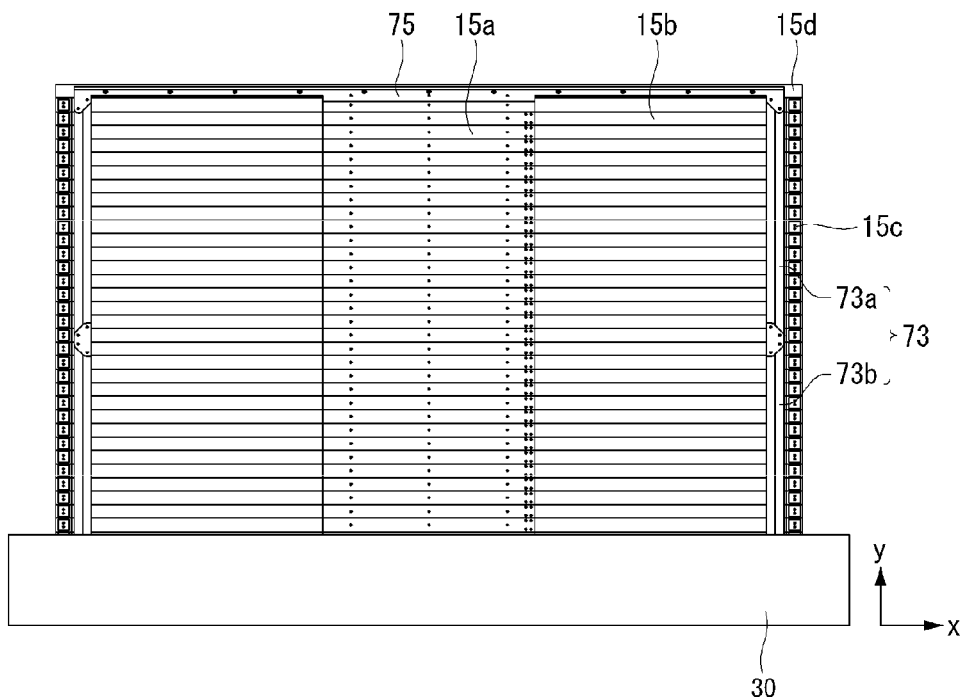
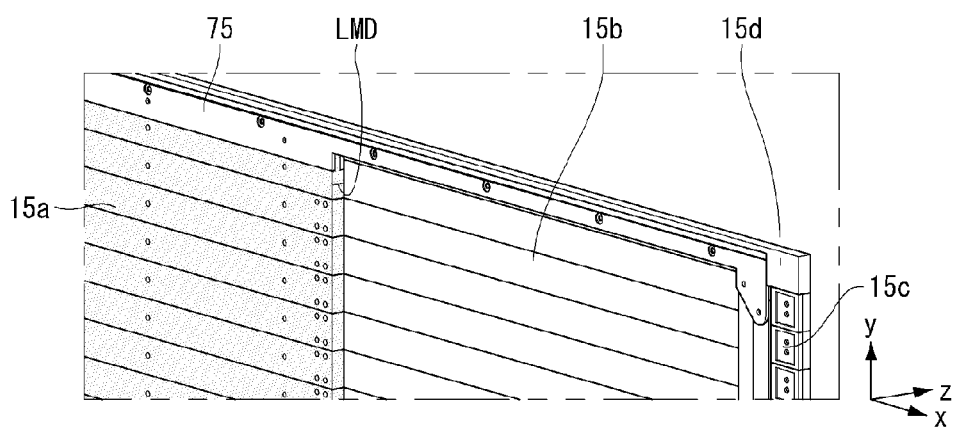

FIG. 37
(a)
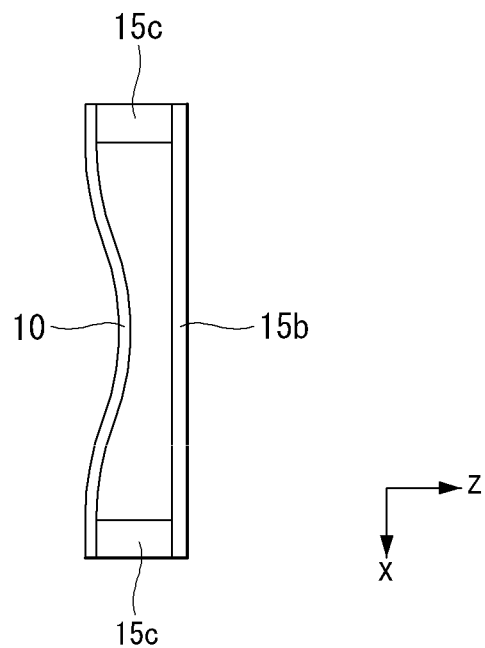
(b)
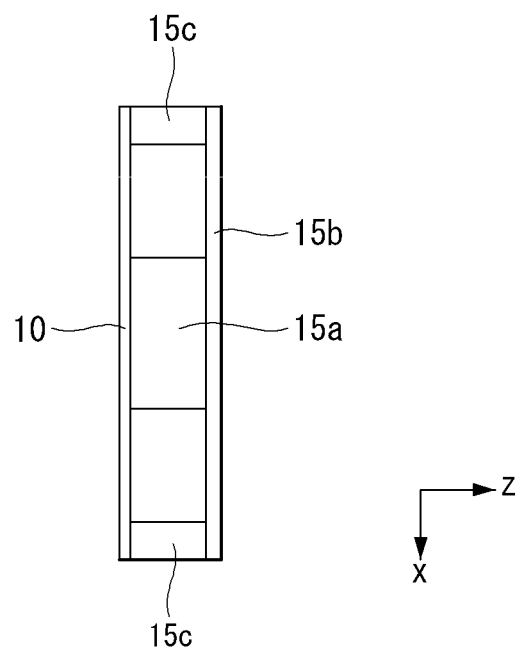

DISPLAY DEVICE

This application claims the benefit of Korean Patent Application No. 10-2015-0167365 filed on Nov. 27, 2015, and No. 10-2015-0185197 filed on Dec. 23, 2015, the entire contents of which are incorporated herein by reference for all purposes as if fully set forth herein.

BACKGROUND

Field of the Disclosure

The present disclosure relates to a display device, and more particularly, to a display device with supports that are positioned between first and third module covers so that the supports are shielded from the outside, and allowing the user to immerse themselves into the display screen.

Background

With the development of the information society, demand for various displays is increasing. Responding to this demand, various displays such as LCDs (liquid crystal display devices), PDPs (plasma display panels), ELDs (electroluminescent displays), VFDs (vacuum fluorescent displays), etc., are being researched and used.

Among these displays, those using organic light-emitting diodes (OLEDs) offer superior luminance and viewing angles compared to LCDs and can be made extremely thin because they work without a backlight.

SUMMARY

One aspect is to provide a display device including a housing; at least one roller positioned within the housing; and a display portion including a display panel and a module cover, and the module cover is divided into a plurality of sections, wherein the display panel and the module cover can transition from a first state where the display panel and the module cover are wound around the at least one roller to a second state where the display panel and the module cover are unwound from the at least one roller, in contact with each other, and exposed out of the housing.

The module cover may include: a first module cover section positioned at a center portion of a back of the display panel in the second state; a third module cover section positioned at both side portions of the back of the display panel in the second state; a second module cover section positioned at a back of the first and third module cover sections in the second state; and a fourth module cover section positioned at top edge portions of the first and second module cover sections, with both side edge portions being connected to the third module cover section.

The display device may further include a motor assembly, a top bar attached to a top portion of the display portion, and a plurality of supports to raise or lower the top bar, one end of the supports being connected to either end of the top bar and the other end being connected to the motor assembly, wherein the top bar may be attached to the top edge of the first module cover section and the fourth module cover section.

The first and fourth module cover sections may be attached to the top bar through at least one hole, and the second module cover section may be attached to the first and third module cover sections through at least one hole.

The first and third module cover sections may be spaced apart from each other by a distance in a horizontal direction.

The display device may further include a motor assembly, a top bar attached to a top portion of the display portion, and a plurality of supports to raise or lower the top bar, one end of the supports being connected to either end of the top bar and the other end being connected to the motor assembly, wherein the supports may be positioned in the space between the first and third module covers.

The display device may further include a motor assembly, a top bar attached to a top portion of the display portion, and a plurality of supports to raise or lower the top bar, one end of the supports being connected to either end of the top bar and the other end being connected to the motor assembly, wherein the fourth module cover section, and flat regions of the first and third module cover sections, which are positioned in the uppermost part of the first and third module cover sections, may remain flat in the first state.

A front surface of the first and third module cover sections may vertically protrude from a front surface of the second module cover section.

The display device may further include a motor assembly, a top bar attached to a top portion of the display portion, and a plurality of supports to raise or lower the top bar, one end of the supports being connected to either end of the top bar and the other end being connected to the motor assembly, wherein each support may include: an upper link, one end of which is connected to either end of the top bar; a hinges connected to the other end of the upper link; and a lower link, one end of which is connected to the hinge and the other end is connected to the motor assembly.

The hinge may include: a body; and an attachment part protruding towards the first module cover section from the body, wherein the attachment part may include a magnetic material.

The second module cover section may include trajectories to correspond to areas where the attachment parts move during a transition from the first state to the second state, where the trajectories may include a magnetic material whose polarity is opposite to that of the attachments parts.

The module cover and the display panel may be held together by magnets positioned on the third module cover section.

The module cover and the display panel may be held together by magnets positioned on the first and third module cover sections.

The display panel and the module cover may be wound or unwound by two rollers.

The at least one roller may include a panel roller to wind or unwind the display panel; and an apron roller to wind or unwind the module cover, in conjunction with the winding or unwinding of the display panel.

The panel roller and the apron roller may be positioned at a same side of the supports within the housing.

The panel roller and the apron roller may be positioned behind the supports within the housing.

The panel roller and the apron roller may be positioned at opposite sides of the supports within the housing.

The panel roller may be positioned in front of the supports within the housing, and the apron roller may be positioned behind the supports within the housing.

The at least one roller may include a guide roller to space the module cover and the panel roller apart from each other.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings:

FIGS. 7 to 31 are views showing a display device according to an exemplary embodiment of the present invention; and FIGS. 32 to 43 are views showing a display device according to another exemplary embodiment of the present invention.

DETAILED DESCRIPTION OF THE EMBODIMENTS

Figure 1:
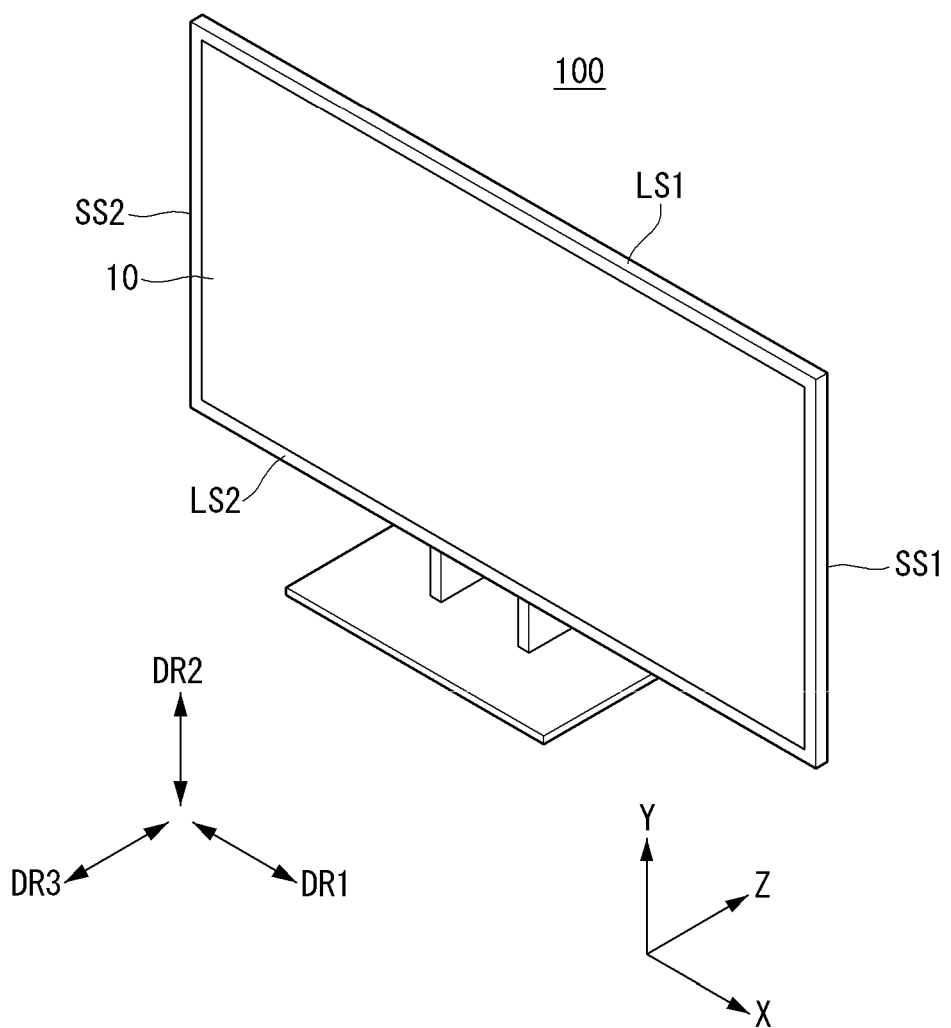
FIGS. 1 to 6 are views showing the configuration of a display device relating to an exemplary embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc., may be used to describe various components, but the components are not limited by such terms. The terms are used for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present disclosure more completely.

Hereinafter, a display panel will be described by taking an organic light-emitting display (OLED) as an example. However, display panels applicable to the present invention are not limited to OLEDs, but may include liquid crystal panels (LCPs), plasma display panels (PDPs), or field emission display panels (FED panels).

FIGS. 1 to 6 are views showing the configuration of a display device relating to an exemplary embodiment of the present invention.

As illustrated in FIG. 1, in what follows, a display panel 10 may include a first long side LS1, a second long side LS2 facing the first long side LS1, a first short side SS1 adjacent to the first long side LS1 and the second long side LS2, and a second short side SS2 facing the first short side SS1.

Here, the first short side SS1 may be referred to as a first side area, the second short side SS2 may be referred to as a second side area facing the first side area, the first long side LS1 may be referred to as a third side area adjacent to the first and second side areas and positioned between the first and second side areas, and the second long side LS2 may be referred to as a fourth side area adjacent to the first and second side areas, positioned between the first and second side areas, and facing the third side area.

For convenience of explanation, the first and second long sides LS1 and LS2 are longer in length than the first and second short sides SS1 and SS2; but, it should be noted that the first and second long sides LS1 and LS2 may be approximately the same length as the first and second short sides SS1 and SS2.

In what follows, a first direction DR1 may be parallel to the long sides LS1 and LS2 of the display panel, and a second direction DR2 may be parallel to the short sides SS1 and SS2 of the display panel 10.

A third direction DR3 may be perpendicular (or orthogonal) to the first direction DR1 and/or the second direction DR2.

The first direction DR1 and the second direction DR2 may be collectively referred to as a horizontal direction or a vertical direction, respectively.

The third direction DR3 may be referred to as orthogonal direction.

Figure 2:
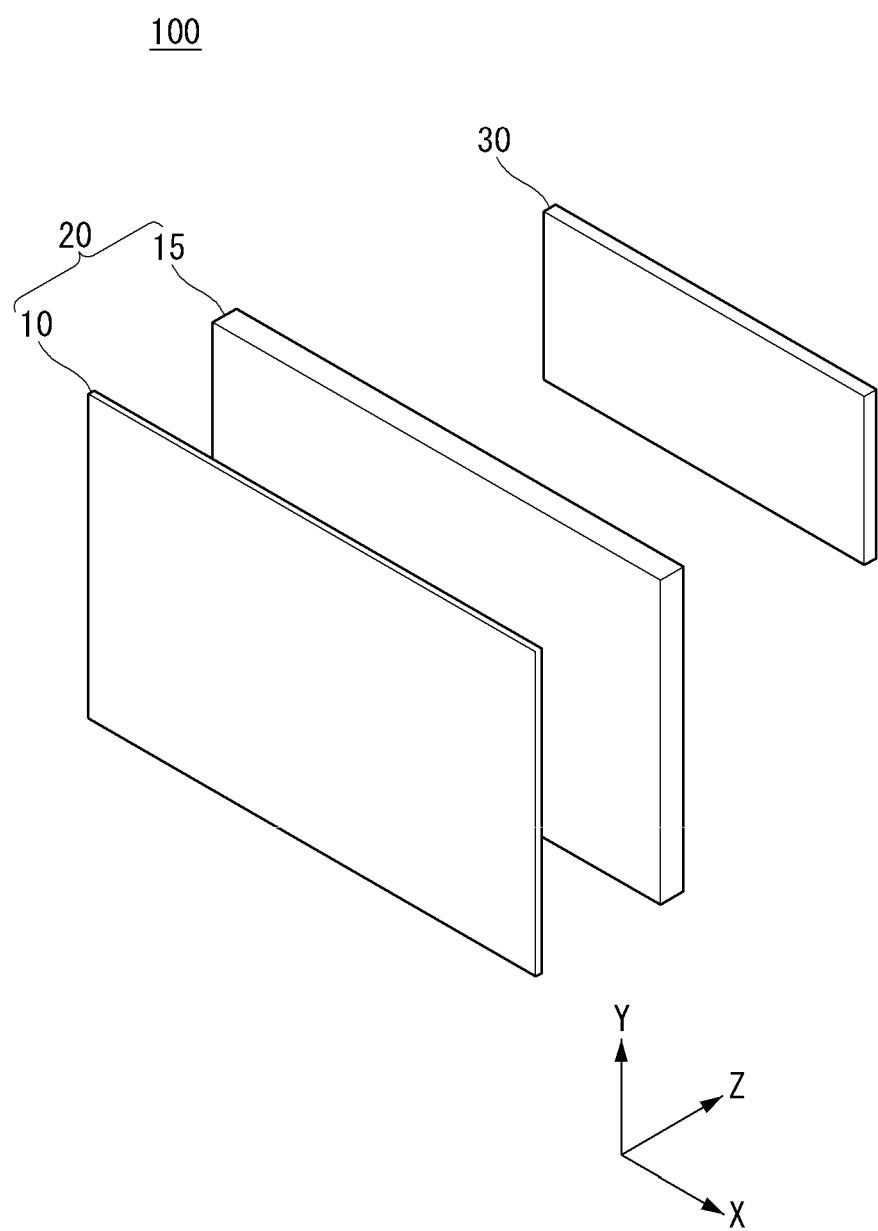

Referring to FIG. 2, the display device 100 according to an embodiment of the present invention may include a display portion 20 and a housing 30.

The display portion 20 may include a display panel 10 and a module cover 15. The display panel 10 may be provided on the front of the display device 100 and display an image. A controller may display an image at the display panel 10 by breaking an image down into pixels and controlling the color, brightness, and intensity of light emitted by each individual pixel at the display panel 10. The display panel 10 may be divided into an active region where an image is displayed and an inactive region where no image is displayed.

The display panel 10 may be rectangular. However, the display panel 10 is not limited to such a shape and also may be shaped to have a predetermined curvature at the corners. The display panel 10 may be an organic light-emitting diode (OLED) panel. However, the display panel is not limited to such a panel. For example, the display panel may be a liquid crystal display panel.

The module cover 15 may be provided behind the display panel 10. The module cover 15 may be attached directly to the display panel 10. The module cover 15 may be the same size as or larger than the display panel 10.

The module cover 15 may support the back of the display panel 10. Accordingly, the module cover 15 may include a material that is lightweight and high in strength. For example, the module cover 15 may include aluminum.

The housing 30 may be provided on the back of the display portion 20. That is, the housing 30 may be provided on the back of the module cover 15. The housing 30 may shield at least one printed circuit board (PCB). That is, the housing 30 may cover at least one PCB attached at the back of the module cover 15. A detailed structure of the at least one PCB and a method of attaching the same will be described below.

Electronic signals from the at least one PCB may be transmitted to the housing 30. Accordingly, the housing 30, though not shown, may be comprised of an inner housing made of conductive material and an outer housing covering the inner housing. However, the housing 30 is not limited to such a structure, and may be a single unit made of conductive material.

Figure 3:
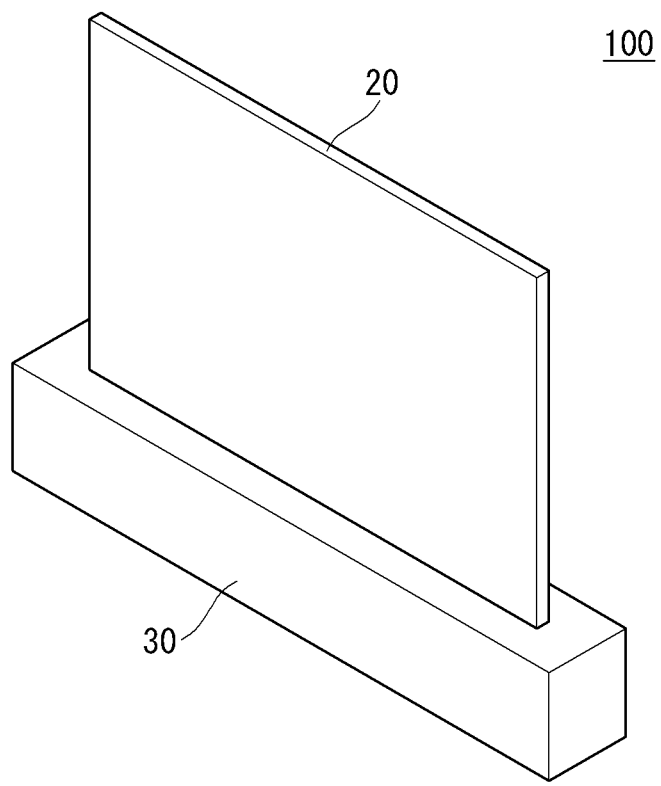

Referring to FIG. 3, in the display device 100 according to an embodiment of the present invention, the housing 30 may be positioned under the display portion 20. In more detail, the housing 30 may have a shape that covers the bottom of the display portion 20. The housing 30 may be configured as not to expose drive equipment or drive circuits in it.

The widths of the housing 30 along the first and third directions may be larger than the width of the display portion 20, in order to protect the display portion within the housing 30. The width of the housing 30 along the second direction may be smaller than the width of the display portion 20, in order to prevent the housing 30 from obstructing the user's field of vision.

In the display device 100 according to the embodiment of the present invention, the housing 30 may not be positioned in the active region of the display portion 20. Accordingly, the display portion 20 may be made thinner, allowing the user to immerse themselves in the screen.

Figure 4:
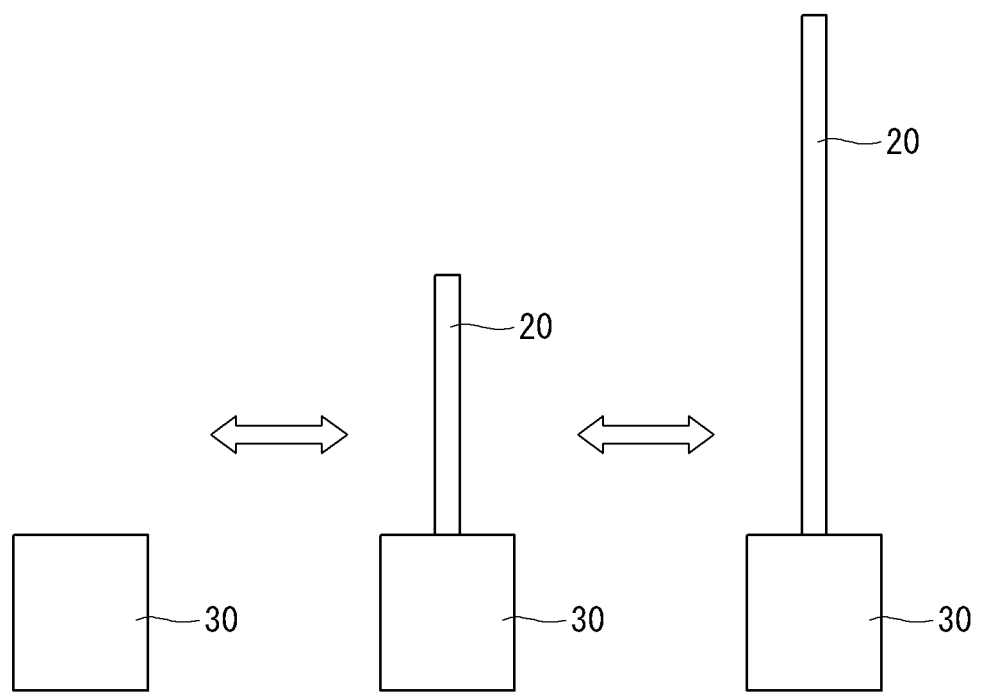

Referring to FIG. 4, in the display device 100 according to the embodiment of the present invention, the active region of the display portion 20 may be in a first state where the active region of the display portion 20 is within the housing 30 or a second state where the active region of the display portion 20 is exposed out of the housing 30.

When the display device 100 is in the first state, the active region of the display portion 20 may be within the housing 30. That is, the display portion 20 may be shielded in the housing 30.

When the display device 100 is in the second state, the active region of the display portion 20 may be exposed out of the housing 30. That is, when the display portion 20 is in the second state, part of the display portion 20 may protrude out above the housing 30.

Although not shown in this figure, the display portion 20 may change from the first state to the second state by means of a roller within the housing 30. In more detail, when the roller unrolls, the display portion 20 may change from the first state in which it is wound around the roller to the second state in which the display portion 20 is unwound from the roller to be exposed to the outside. In contrast, when the roller rolls back, the display portion 20 may change from the second state to the first state. A detailed structure of the roller and the display portion 20 and a method of operating them will be described later.

In the display device 100 according to the embodiment of the present invention, the display portion 20 may be either in the first state or in the second state. Accordingly, the user may save space by only exposing the display portion 20 out of the housing 30 when viewing the display device 100.

Figure 5:
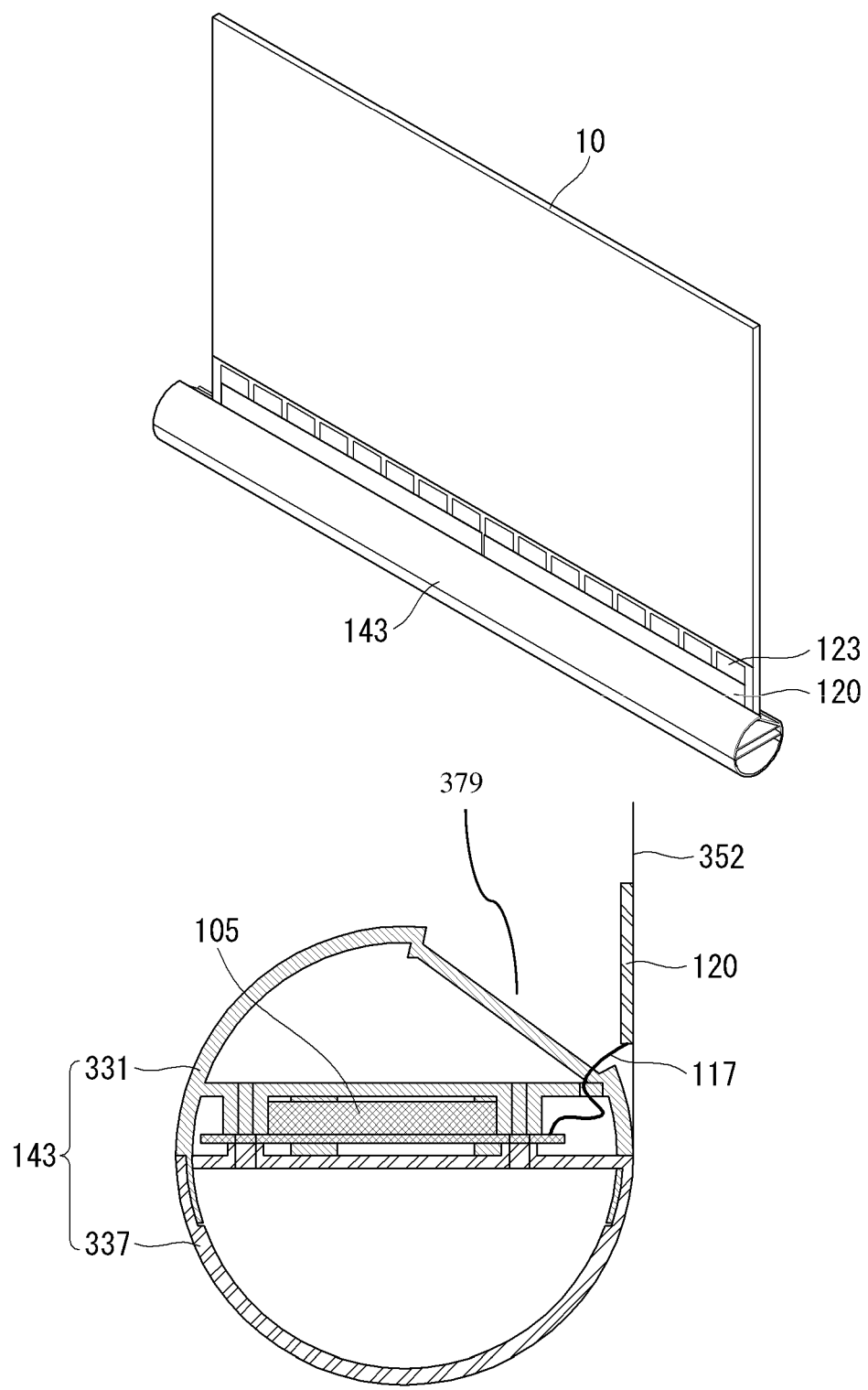

Referring to FIG. 5, in the display device according to the embodiment of the present invention, a panel roller 143 may be connected to one edge of the display panel 10. The panel roller 143 may wind or unwind the display panel 10 in order to bring the display panel 10 to either the first state or the second state.

In the display device according to the embodiment present invention, at least one source PCB 120 may be positioned on at least part of the front surface of the display panel 10. Each source PCB 120 may be spaced apart from each other.

The at least one source PCB 120 may have signal wires for transmitting digital video data and timing control signals from a timing controller board 105 within the panel roller 143. The source PCB 120 may be connected to the display panel 10 by a source chip on film (COF) 123. The source COF 123 connected to one side of the source PCB 120 may connect to the display panel 10 as it extends to the active region of the display panel 10.

A seat portion 379 may be positioned on the outer circumference of the panel roller 143. That is, at least part of the outer circumference of the panel roller 143 is flat. The seat portion 379 may be positioned where the source PCB 120 makes contact with the panel roller 143 as the panel roller 143 is rolled. The seat portion 379 may be shaped in such a way that at least part of the outer circumference of the panel roller 143 is depressed.

When the panel roller 143 rolls in the display panel 10, the source PCB 120 may sit in the seat portion 379 and at least part of it may make contact with the panel roller 143. Accordingly, the source PCB 120 may not get damaged even if the panel roller 143 rolls in the display panel 10.

The timing controller board 105 may be mounted inside the panel roller 143. Mounting the timing controller board 105 inside the panel roller 143 may prevent an FFC cable 117 connecting to the source PCB board 120 from getting tangled.

The panel roller 143 may include an upper panel roller portion 331 and a lower panel roller portion 337. As an example, the upper panel roller portion 331 and the lower panel roller portion 337 may be held together with at least one screw. The timing controller board 105 may be mounted in between the upper panel roller portion 331 and the lower panel roller portion 337. The at least one screw may hold the timing controller board 105 in place while holding the upper panel roller portion 331 and the lower panel roller portion 337 together. The FFC cable 117 may connect the timing controller board 105 with the source PCB 120 via a hole in the upper panel roller portion 331.

The display device according to the embodiment of the present invention allows for connecting the FFC cable 117 without it getting tangled because the timing controller board 105 rotates together with the panel roller 143, and also can save space because the timing controller board 105 is mounted inside the panel roller 143.

Figure 6:
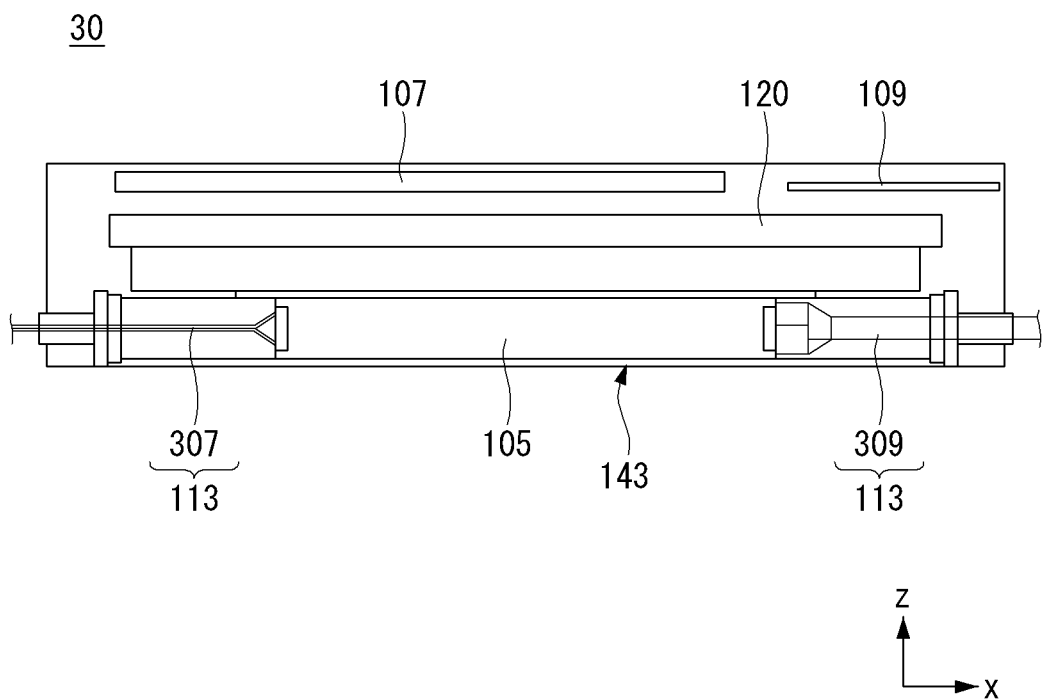

Referring to FIG. 6, in the display device according to an embodiment of the present invention, the timing controller board 105 is mounted in the panel roller 143 at one side of the center of the housing 30 where the display panel ascends or descends, and a main board 109 and a power supply 107 may be positioned on the other side of the center of the housing 30.

The timing controller board 105 may be connected to the main board 109 and the power supply 107. The timing controller board 105 may be connected to the main board 109 and the power supply 107 through wire electrodes 113. In more detail, the wire electrodes 113 may include a first wire electrode 307 connecting the timing controller board 105 and the power supply 107 and a second wire electrode 309 connecting the timing controller board 105 and the main board 109.

For example, a plurality of first wire electrode 307 may be provided. Also, the first wire electrode 307 may have a round shape. The first wire electrode 307 may connect the timing controller board 105 with the power supply 107 via an opening in the center of the axis of rotation of the panel roller 143.

The second wire electrode 309 may use a flat flexible cable (FFC) cable that connects the timing controller board 105 with the source PCB 120. The second wire electrode 309 may connect the timing controller board 105 with the main board 109 via an opening in the center of the axis of rotation of the panel roller 143.

The first wire electrode 307 and the second wire electrode 309 may be positioned on opposite sides of the timing controller board 105. The openings leading to the first wire electrode 307 and the second wire electrode 309 also may be positioned on opposite sides.

In the display device according to the embodiment of the present invention, the timing controller board 105 may be mounted in the panel roller 143, and the power supply 107 and the main board 109 may be positioned on opposite sides of the display panel in the panel roller 143. This can save a lot of space in the housing 30.

FIGS. 7 to 31 are views showing a display device according to an exemplary embodiment of the present invention.

Figure 7:
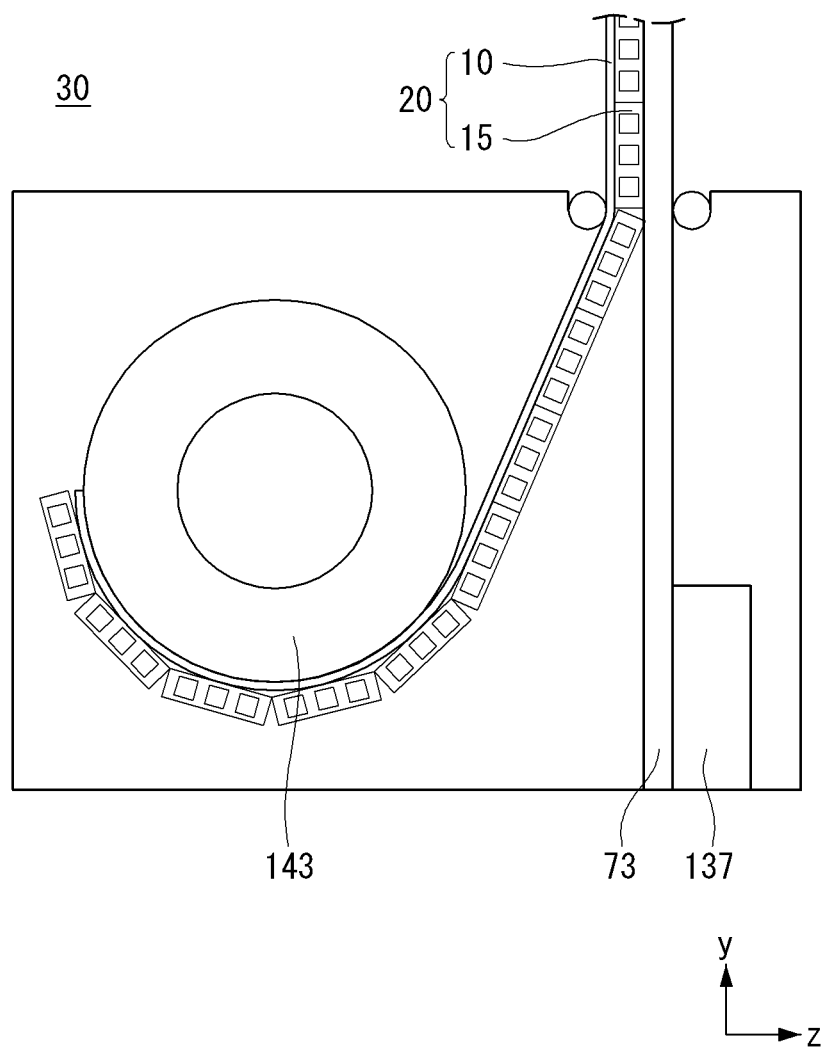

Referring to FIG. 7, the display device according to the present invention may include the panel roller 143, motor assemblies 137, and supports 73, within the housing 30.

The panel roller 143 may be positioned in front of where the display portion 20 ascends or descends in the housing 30. The panel roller 143 may wind or unwind the display panel 10 and the module cover 15 simultaneously. Since the module cover 15 is thick, the diameter of the panel roller 143 may increase a lot during a transition from the first state to the second state. Accordingly, the panel roller 143 may be spaced a certain distance or farther apart from each side of the housing 30, for instance, in the third direction.

The supports 73 may be positioned where the display portion 20 ascends or descends. The supports 73 may function to support the display panel 10 and the module cover 15 as they ascend or descend. In more detail, although not shown in this figure, the supports 73 may raise or lower a top bar attached to the top of the module cover 15 and display panel 10. A detailed method of operating the supports 73 will be described later.

Because only the top portions of the module cover 15 and display panel 10 are connected to the top bar, the rest of them may bend easily. Accordingly, the supports 73 may support the module cover 15 from the back of the module cover 15 to keep the module cover 15 from bending. The supports 73 are not attached to the module cover 15 since they keep moving during a transition from the first state to the second state. However, the supports 73 can still support the module cover 15.

The motor assemblies 137 may be positioned to connect with the supports 73. The motor assemblies 137 may cause the supports 73 to ascend or descend. The motor assemblies 137 may take electrical signals and convert them into physical force. The motor assemblies 137 may transmit rotational energy to the supports 73, thereby making a transition from the first state to the second state. Detailed description of the structure and operating principle of the motor assemblies 137 will be given later.

In the display device according to the embodiment of the present invention, the display panel 10 and the module cover 15 may be simultaneously wound or unwound by one roller. This may lead to a decrease in the thickness of the housing 30, thus giving the user a better view of the screen.

Figure 8:
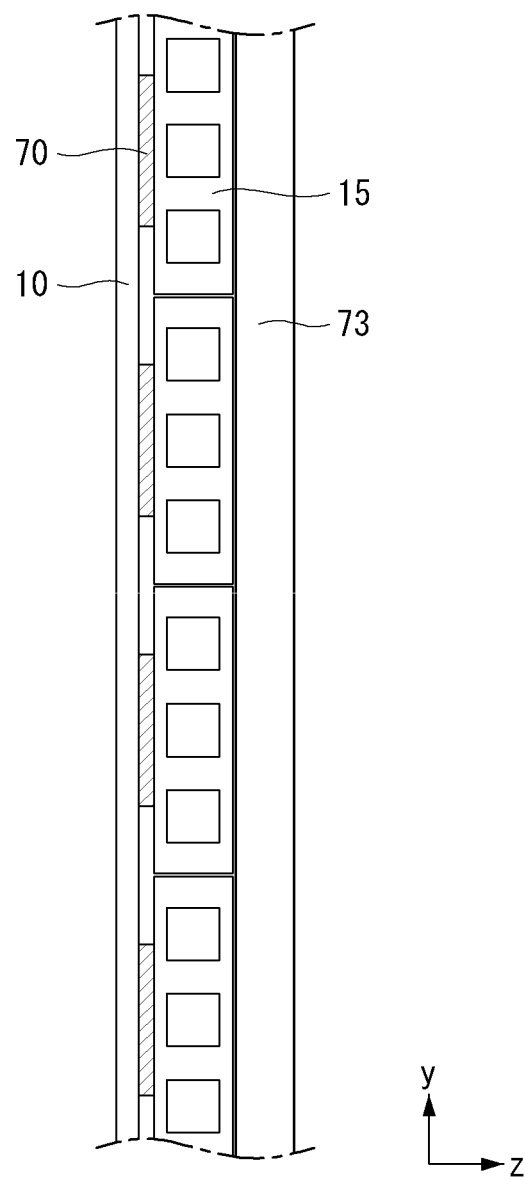

Referring to FIG. 8, the module cover 15 may include a plurality of aprons. The aprons may be rectangular. The aprons may be spaced apart from one another and attached to the back of the display panel 10. Because the module cover 15 comprises of a plurality of aprons, its shape may deform easily when it is wound around or unwound from the roller. The module cover 15 may include a plastic or aluminum material. Accordingly, the module cover 15 may protect the display panel 10 from external impact.

The display panel 10 and the module cover 15 may be held together by an adhesion layer 70. The adhesion layer 70 may be double-sided tape. Using the adhesion layer 70, the module cover 15 may be wound or unwound along with the display panel 10. A segment of the adhesion layer 70 may be positioned on an apron and adhere to the display panel 10. Each segment of the adhesion layer 70 may be set apart from each other. Accordingly, the shape of the module cover 15 may deform easily when it is wound around or unwound from the roller. The smaller the width of the adhesion layer 70 along the second direction, the less the display panel 10 will deform on external force. In more detail, the smaller the width of the adhesion layer 70 along the second direction, the more flexible it can be, thus transmitting less external force on the display panel 10.

Moreover, the larger the width of the aprons along the second direction, the less likely the display panel 10 will have cracks. In more detail, the larger the width of the aprons along the second direction, the higher the rigidity; thus, no cracks will appear in the display panel 10.

Therefore, if the width of the adhesion layer 70 along the second direction is no more than 30% of the width of the aprons along the second direction, less external force is transmitted to the display panel 10, and this may lead to less bumps on the display screen.

Also, if the width of the adhesion layer 70 along the second direction is no less than 15% of the width of the aprons along the second direction, the rigidity of the display panel 10 is improved, and this may lead to less cracks in the display panel 10.

Moreover, the larger the width of the adhesion layer 70 along the third direction, the less the display panel 10 will deform on external force. In more detail, the larger the width of the adhesion layer 70 along the third direction, the more flexible it can be, thus transmitting less external force on the display panel 10.

In addition, the smaller the width of the aprons along the third direction, the less likely the display panel 10 will have cracks. In more detail, the larger the width of the aprons along the third direction, the higher the rigidity; thus, no cracks will appear in the display panel 10.

Therefore, if the width of the adhesion layer 70 along the third direction is no less than 3% of the width of the aprons along the third direction, less external force is transmitted to the display panel 10, and this may lead to less bumps on the display screen.

Also, if the width of the adhesion layer 70 along the third direction is no more than 6% of the width of the aprons along the third direction, the rigidity of the display panel 10 is improved, and this may lead to less cracks in the display panel 10.

In the display device according to the embodiment of the present invention, the module cover 15 may include a plurality of aprons, and the adhesion layer 70 may sit on the aprons. Accordingly, the shape of the module cover 15 may deform more easily when it is wound around the roller, compared to when the module cover 15 is configured as a single unit.

Referring to FIG. 9, in a display device according to another exemplary embodiment of the present invention, the aprons may be in the shape of parallelograms. That is, the aprons may be in the shape of rectangles slanted in one direction. The aprons having the shape of parallelograms may prevent the display panel from bending in the opposite direction to the direction in which the display panel is wound. Accordingly, the display panel may remain flat in the second state.

When an external force is applied to the aprons in the opposite direction 351 to the direction the display panel is wound, the aprons may not rotate anymore because their surfaces come into contact with one another (see FIG. 9(*a*)). Accordingly, the display panel may remain flat.

In contrast, when an external force is applied to the aprons in the direction 353 the display panel is wound, the aprons may rotate freely because their surfaces do not come into contact with one another (see FIG. 9(*b*)). Accordingly, the display panel may be wound or unwound with ease.

In the display device according to the embodiment of the present invention, the aprons may rotate only in one direction. Accordingly, the screen will not bend even if an external force is applied to the display panel.

Figure 10:
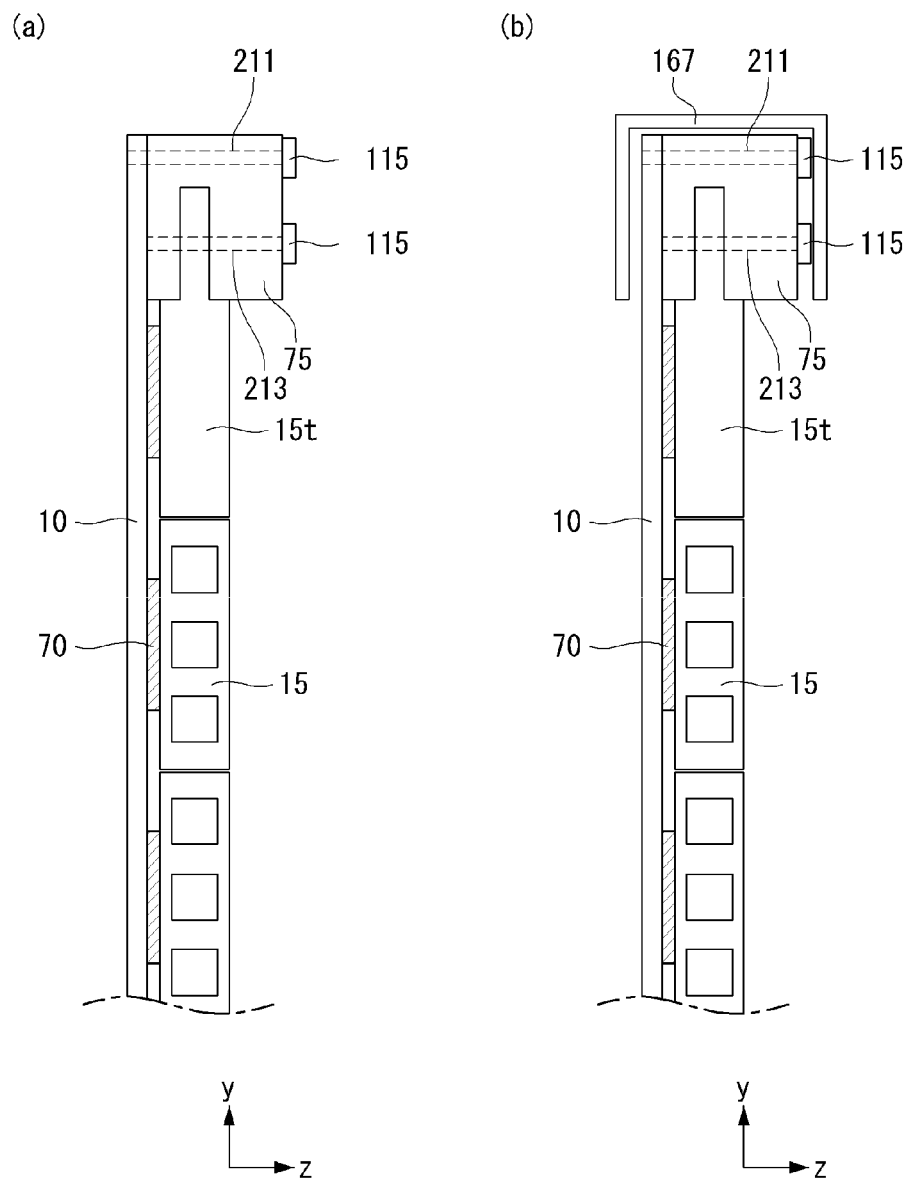

Referring to FIG. 10, in the display device according to an embodiment of the present invention, the module cover 15 and the display panel 10 may be fastened to a top bar 75. For example, the module cover 15 and the display panel 10 may be fastened to the top bar 75 with at least one screw 115.

The at least one screw 115 allows the module cover 15 and the display panel 10 to ascend or descend together with the top bar 75, without deviating from each other. The at least one screw 115 may fasten the top bar 75 and the module cover 15 together and fasten the top bar 75 and the display panel 10 together. However, the at least one screw 115 is not limited to such a configuration, but may fasten the module cover 15 and the display panel 10 together.

An upper module cover 15*t* of the module cover 15 may differ in shape from the rest of the module cover 15 so as to be attached to the top bar 75. The upper module cover 15*t* may be the uppermost apron. In more detail, the uppermost apron may have a different shape than the other aprons. At least a part of the upper module cover 15*t* may have a different thickness from the rest along the third direction. The part having a different thickness from the rest may be inserted into a recess of the top bar 75.

The part having a different thickness from the rest of the upper module cover 15*t* may be fastened to the top bar 75, for example, by at least one screw 115. Since the upper module cover 15*t* is inserted into the top bar 75, the module cover 15 may be fastened more firmly to the top bar 75.

As illustrated in FIG. 10(*b*), the top bar 75, the module cover 15, and the display panel 10 may be covered by a top case 167. The top case 167 may shield the top bar 75, the module cover 15, and the display panel 10 on both sides and the top. The at least one screw 115 may fasten the top case 167, together with the top bar 75, the module cover 15, and the display panel 10. However, the top case 167 is not limited to such a configuration, but may be inserted into recesses in the top bar 75, module cover 15, and display panel 10.

In the display device according to the embodiment of the present invention, the top bar 75, the module cover 15, and the display panel 10 may be held together. Accordingly, the module cover 15 and the display panel 10 may ascend or descend easily without deviating from each other.

Moreover, the top case 167 may cover the top bar 75, the module cover 15, and the display panel 10. Thus, the user may find the look of the display device more neat and tidy.

Figure 11:
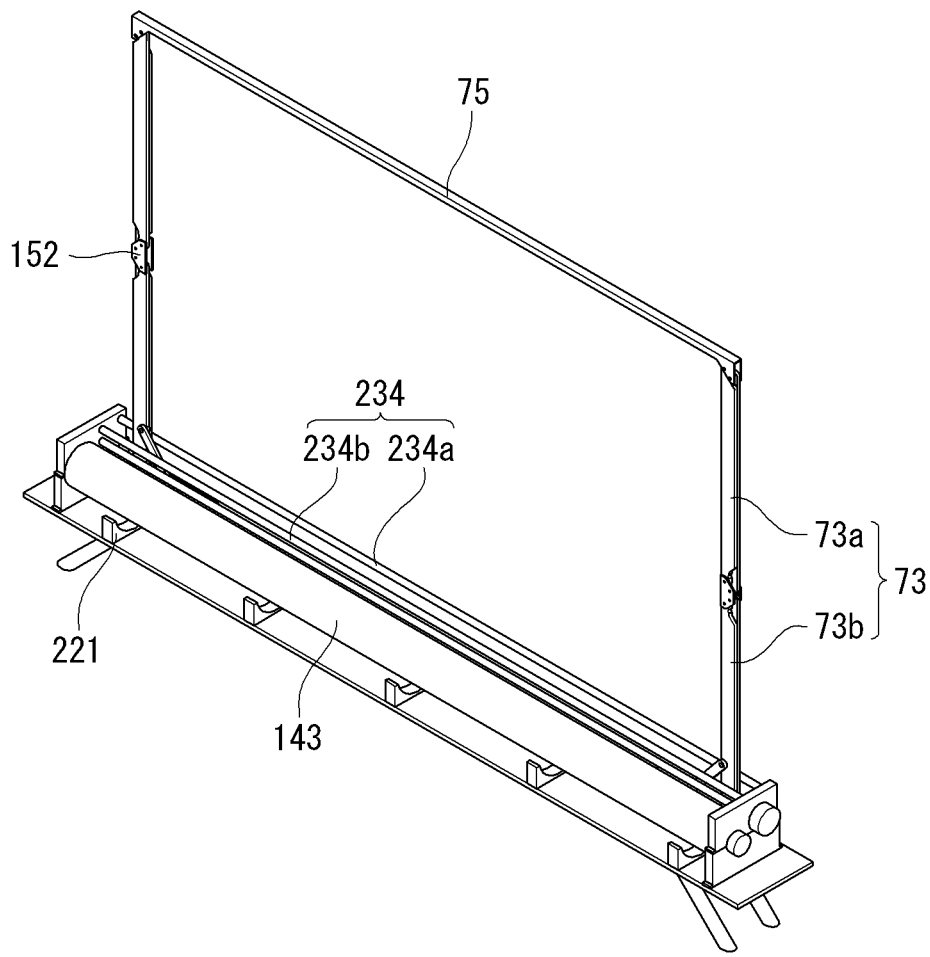

Referring to FIG. 11, the display device according to an embodiment of the present invention may be so shaped that both sides of the top bar 75 are supported by the supports 73. The top bar 75 may ascend or descend by means of the supports 73. Each support 73 may include an upper link 73*a* and a lower link 73*b*.

The upper link 73*a* and the lower link 73*b* may be connected by a hinge 152. One end of the upper link 73*a* may be fastened to the top bar 75 and the other end to the hinge 152, and one end of the lower link 73*b* may be fastened to the motor assembly and the other end to the hinge 152.

A guide bar 234 may be positioned at the entrance where the supports 73 ascend from or descend into the housing. The guide bar 234 may include first and second guide bars 234*a* and 234*b*. The first and second guide bars 234*a* and 234*b* may face each other, with the supports 73 in between. For example, the first guide bar 234*a* may be positioned in front of the supports 73, and the second guide bar 234*b* may be positioned behind the supports 73.

The panel roller 143 may be positioned at the bottom, in front of the supports 73. The panel roller 143 may be provided with at least one bracket 221 corresponding to the bottom surface of the housing. For example, at least one bracket 221 may be positioned below the panel roller 143. The at least one bracket 221 may be spaced apart from one another. For example, the at least one bracket 221 may be fixed to the bottom surface of the housing with screws.

The display device according to the embodiment of the present invention may have various operating mechanisms in it. This may reduce the risk of breakdown that may occur when the display panel ascends or descends by means of the roller.

Figure 12:
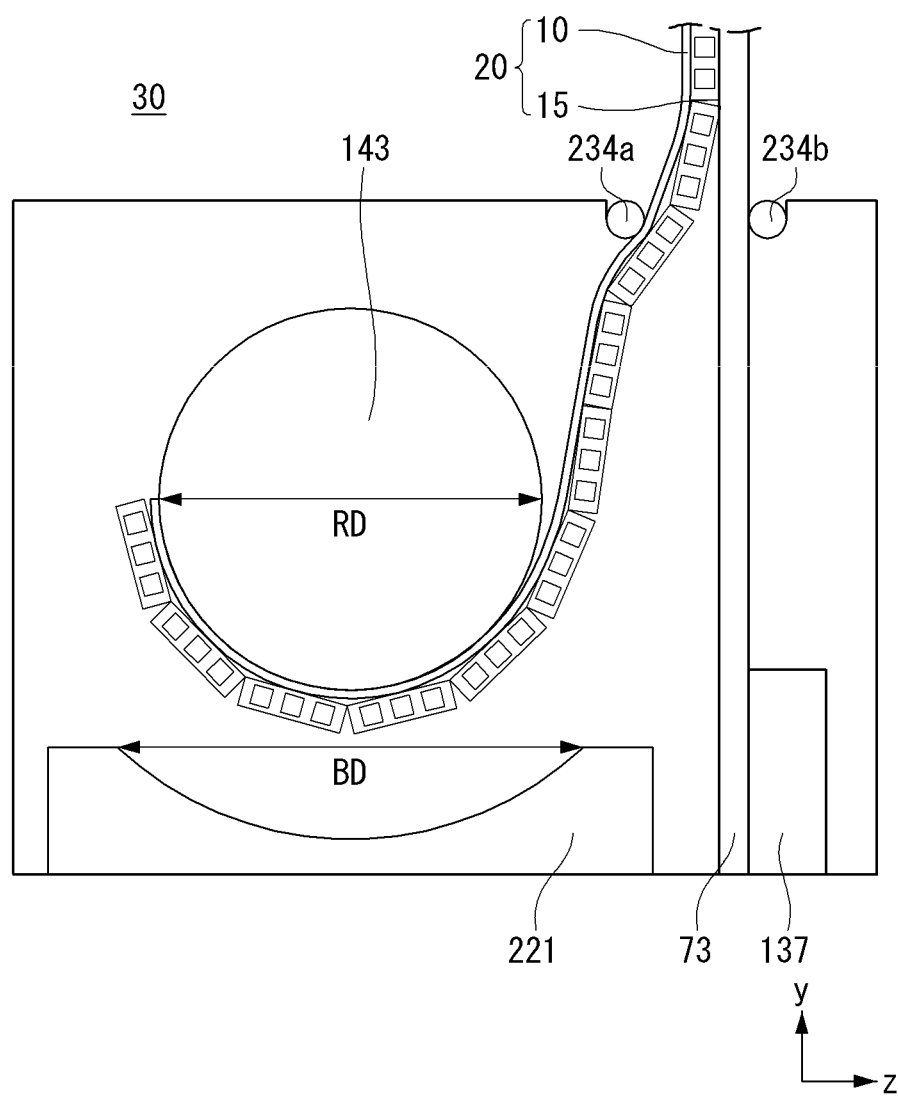

Referring to FIG. 12, the first guide bar 234*a* may guide the display panel 10 and module cover 15 wound around the panel roller 143 at a part of the housing 30 where they ascend or descend. Accordingly, the display panel 10 and the module cover 15 may ascend or descend from a desired position even if their position does not correspond to where the panel roller 143 ascends or descends the display panel 10 and the module cover 15. The display panel 10 and the module cover 15, both in the first and second states, may come into contact with the first guide bar 234*a* at the entrance of the housing 30. Accordingly, the display panel 10 and the module cover 15 may ascend or descend from the same position regardless of which state they are in.

The bracket 221 may be positioned below the panel roller 143. A side of the bracket 221 facing the panel roller 143 may be concaved. The bracket 221 may guide the display panel 10 and module cover 15 wound around the panel roller 143 in such a way that they are not dragged against the bottom surface of the housing 30. Accordingly, the diameter BD of the concaved portion of the bracket 221 may be larger than the diameter RD of the panel roller 143. If the diameter BD of the concaved portion of the bracket 221 is smaller than the diameter RD of the panel roller 143, the display panel 10 and the module cover 15 may deviate from the bracket 221 and be dragged against the bottom surface of the housing 30. The bracket 221 may include rubber or plastic in order to prevent damage due to friction with the display panel 10 and the module cover 15.

Referring to FIG. 13, in the case that the bracket 221 is not provided as shown in FIG. 13(a), when the display panel 10 and the module cover 15 are unwound from the panel roller 143, they may be dragged against the bottom surface of the housing 30. Accordingly, the display panel 10 or the module cover 15 may have cracks. Also, the display panel 10 and the module cover 15 may not be freely wound.

In contrast, in the case that the bracket 221 is positioned below the panel roller 143 as shown in FIG. 13(b), when the display panel 10 and module cover 15 are unwound from the panel roller 143, they may make contact with the bracket 221. Since the concaved portion of the bracket 221 has a semicircular shape, the display panel 10 and the module cover 15 may keep their rolled shape, rather than hanging down. Also, the bracket 221 may prevent the display panel 10 and the module cover 15 from damage due to friction with the housing 30.

Figure 14:
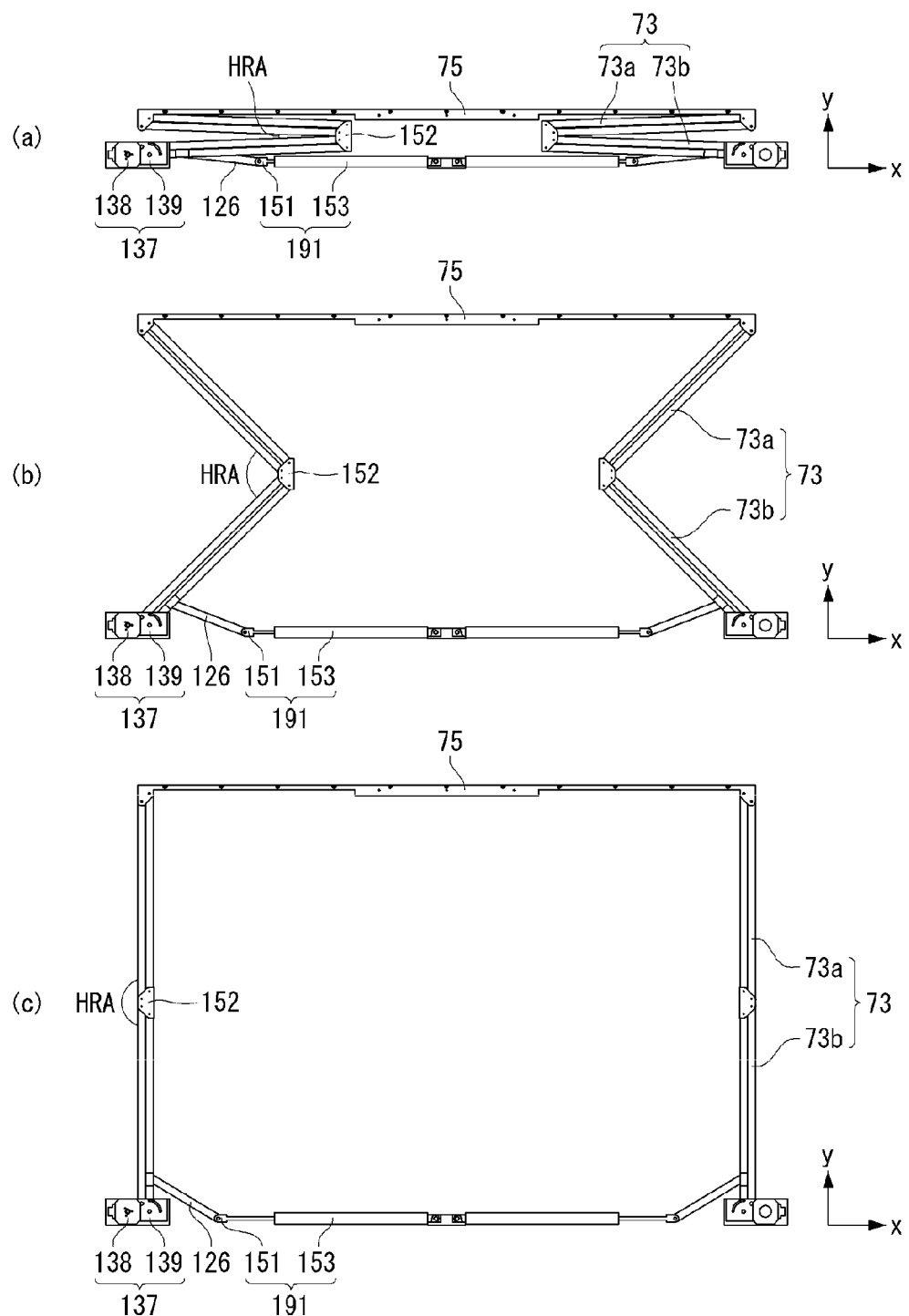

Referring to FIG. 14, in the display device according to an embodiment of the present invention, the top bar 75 may ascend during a transition from the first state to the second state. The top bar 75 may ascend or descend as it is pushed by the supports 73 on two opposite edges.

As illustrated in FIG. 14(a), in the first state, the angle HRA between the upper link 73a and the lower link 73b may be very small. Thus, the top bar 75 has not ascended. Also, the display panel and the module cover may be kept wound around the panel roller.

As illustrated in FIG. 14(b), as the motor assembly 137 rotates, the angle HRA between the upper link 73a and the lower link 73b may increase. An increase in the angle HLA between the upper link 73a and the lower link 73b may allow the top bar 74 to ascend. Accordingly, the display panel and module cover wound around the panel roller may become gradually unwound.

As illustrated in FIG. 14(c), in the second state, the upper link 73a and the lower link 73b may be parallel to each other. That is, the angle HLA between the upper link 73a and the lower link 73b may be 180 degrees. Accordingly, the top bar 75 may be at the maximum height. Also, the display panel and the module cover may become fully unwound from the panel roller.

Figure 15:
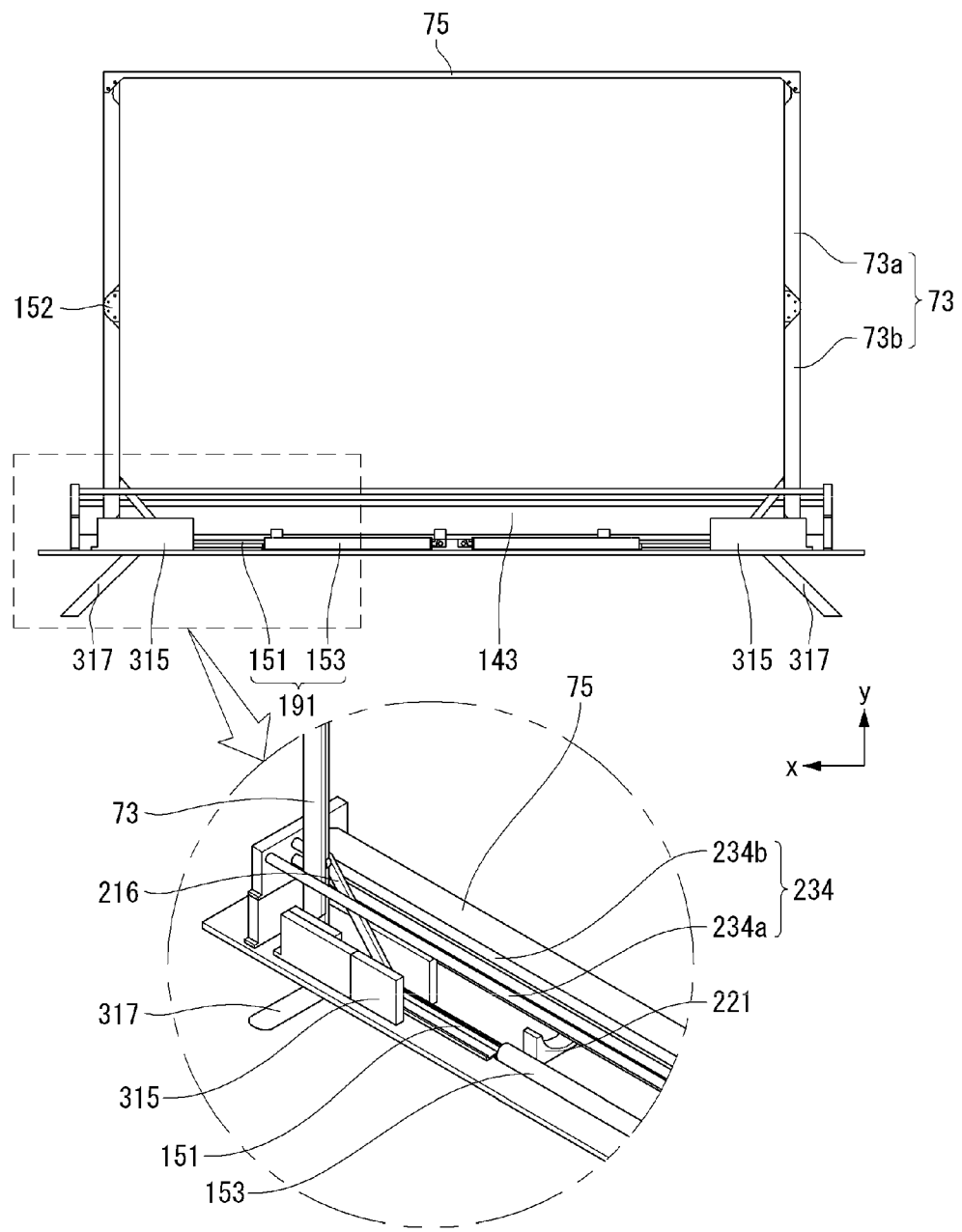

Referring to FIG. 15, in the display device according to the embodiment of the present invention, a stand fixing portion 315 and a stand 317 may be positioned behind the motor assembly.

The stand fixing portion 315 may be positioned corresponding to the motor assembly 137 and shield the motor assembly 137. The stand fixing portion 315 may be fastened to the motor assembly 137 and the housing 30 so that the stand 317 is fixed to the housing 30.

Since the stand fixing portion 315 and the stand 317 correspond to the motor assembly 137, they may be positioned on either side of the display device.

The stand 317 may be connected to the stand fixing portion 315 and be exposed to the outside of the housing 30. The stand 317 may have the shape of a cylinder extending in one direction. The stands 317 on both sides of the display device may serve as legs of the display device. That is, the stands 317 may serve to support the display device.

The stand 317 may rotate with respect to the stand fixing portion 315. Accordingly, the user may rotate the stand 317 to bring the bottom surface of the housing 30 into contact with the ground. That is, the stand 317 may be rotated in such a way as to not make contact with the ground such that the height of the display panel 10 corresponds to the height of the user's eyes. In this case, the user may adjust the height of the display panel 10 to the height of their eyes by rotating the stand 317.

Figure 16:
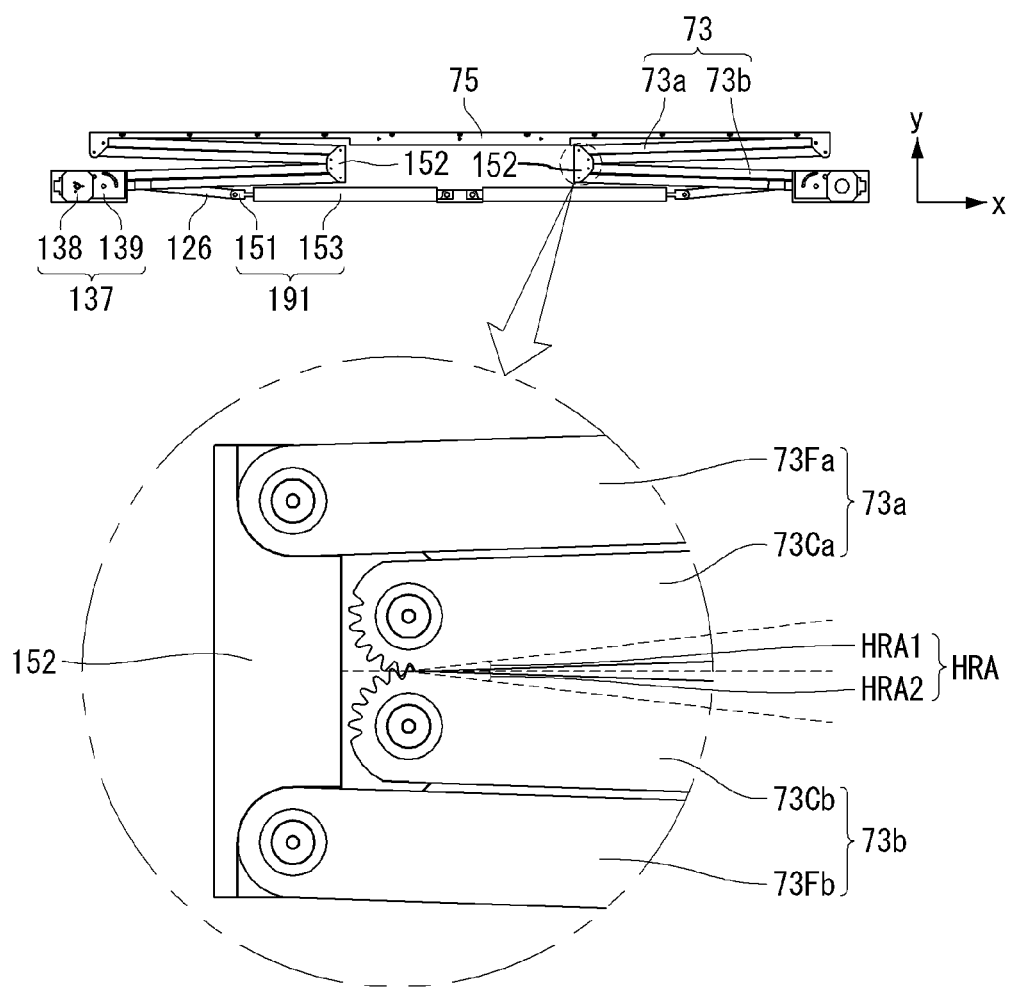

Referring to FIG. 16, in the display device according to the embodiment of the present invention, the upper link 73a may comprise of multiple parts, and likewise the lower link 73b may comprise of multiple parts.

In more detail, the upper link 73a may include a first upper link 73Ca and a second upper link 73Fa. Likewise, the lower link 73b may include a first lower link 73Cb and a second lower link 73Fb.

The first upper and lower links 73Ca and 73Cb may be positioned further outward than the second upper and lower links 73Fa and 73Fb. The first upper and lower links 73Ca and 73Cb may be connected to the center of the hinge 152, and the second upper and lower links 73Fa and 73Fb may be connected to both sides of the hinge 152.

The end portions of the first upper and lower links 73Ca and 73Cb inside the hinge 152 may be in the shape of gears meshing with each other. The hinge 152 may hold the first upper link 73Ca and the first lower link 73Cb in place so that the gears of the first upper and lower links 73Ca and 73Cb mesh with each other.

The angle HRA1 from the horizontal line passing between the first upper link 73Ca and the first lower link 73Cb (ground) to the first upper link 73Ca, and the angle HRA2 from the ground to the first lower link 73Cb may be equal because the first upper link 73Ca and the first lower link 73Cb are in the shape of gears meshing with each other and symmetric with respect to the ground. Also, the angle between the first upper link 73Ca and the first lower link 73Cb may be equal for support 73 of both hinges 152. Accordingly, the top bar 75 operated by the upper link 73a and the lower link 73b of support 73 of both hinges 152 may ascend or descend to the same height without misalignment. That is, the angle between the first upper link 73Ca and the first lower link 73Cb may be equal on both hinges 152, regardless of which state the display panel is in.

The second upper and lower links 73Fa and 73Fb may support the first upper and lower links 73Ca and 73Cb on the inside of the second upper and lower links 73Fa and 73Fb. The angle between the second upper link 73Fa and the second lower link 73Fb may change the same way as the angle between the first upper link 73Ca and the first lower link 73Cb does.

Referring to FIG. 17, in a display device according to a previous embodiment of an invention, the upper and lower links 73a and 73b were configured as a single link, as illustrated in FIG. 17(a). Accordingly, when an external force F was applied to one side of the display panel, the angle HRA between the upper and lower links 73a and 73b on that side became distorted. Accordingly, the angle HRA between the upper and lower links 73a and 73b differed between the two hinges. In this case, one side of the display panel became slanted as illustrated in FIG. 17(b).

In contrast, in the display device according to the embodiment of the present invention, the second upper and lower links 73Fa and 73Fb may support the first upper and lower links 73Ca and 73Cb even if an external force F is applied to one side of the display panel, as illustrated in FIG. 17(c). Accordingly, the angle HRA between the upper and lower links 73a and 73b may not change. In this case, the display panel may be kept from slanting, allowing the user to immerse themselves in the display screen without distraction. Moreover, any damage due to the slant of the display panel may be prevented.

Figure 18:
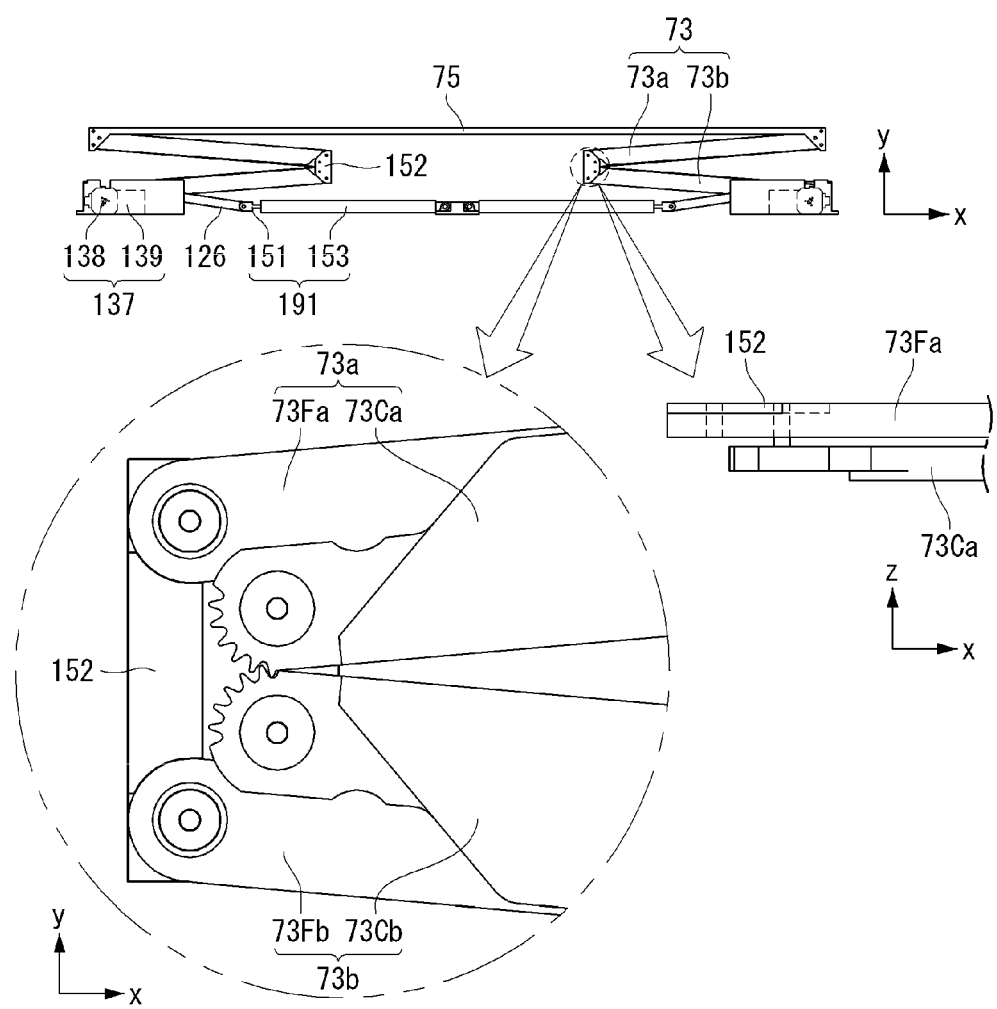

Referring to FIG. 18, in the display device according to an embodiment of the present invention, one side of the first upper and lower links 73Ca and 73Cb may be extended toward the second upper and lower links 73Fa and 73Fb. That is, the width of the first upper and lower links 73Ca and 73Cb may be increased and larger when viewed from the front (away from the hinge side). Accordingly, the first upper and lower links 73Ca and 73Cb may shield the second upper and lower links 73Fa and 73Fb in the front.

The rotational axis of the first upper and lower links 73Ca and 73Cb may be at a different height from that of the second upper and lower links 73Fa and 73Fb. In more detail, the rotational axis of the first upper and lower links 73Ca and 73Cb may be at a different height from that of the second upper and lower links 73Fa and 73Fb, along the third direction (z direction). That is, the vertical height of a portion of the hinge 152 that is connected to the first upper and lower links 73Ca and 73Cb may be different from the vertical height of a portion of the hinge 152 that is connected to the second upper and lower links 73Fa and 73Fb. Accordingly, even if one side of the first upper and lower links 73Ca and 73Cb extends toward the second upper and lower links 73Fa and 73Fb, the first upper and lower links 73Ca and 73Cb may not come into contact with the second upper and lower links 73Fa and 73Fb.

Although not shown, one side of the second upper and lower links 73Fa and 73Fb may be extended toward the first upper and lower links 73Ca and 73Cb. That is, the width of the second upper and lower links 73Fa and 73Fb may be increased and larger when viewed from the rear (toward the hinge side). Accordingly, the second upper and lower links 73Fa and 73Fb may shield the first upper and lower links 73Ca and 73Cb in the front.

Referring to FIG. 19, in the first state, the first upper and lower links 73Ca and 73Cb and the second upper and lower links 73Fa and 73Fb may overlap, respectively, at least partially in width, as illustrated in FIG. 19(a). For example, the first upper and lower links 73Ca and 73Cb and the second upper and lower links 73FA and 73Fb may partially overlap such that there is a certain distance SLD between the first upper link 73Ca and the second upper link 73Fa, and a certain distance SLD between the first lower link 73Cb and the second lower link 73Fb. Accordingly, the entire width of the upper link 73a may be larger than the width HLW of the second upper link 73Fa or the width CLW of the first upper link 73Ca.

In contrast, as illustrated in FIG. 19(b), in the second state, the first upper and lower links 73Ca and 73Cb and the second upper and lower links 73Fa and 73Fb may overlap fully in width with each other. For example, the first upper and lower links 73Ca and 73Cb and the second upper and lower links 73FA and 73Fb may fully overlap such that there is no certain distance SLD between the first upper link 73Ca and the second upper link 73Fa, and no certain distance SLD between the first lower link 73Cb and the second lower link 73Fb. Accordingly, the entire width HLW of the upper link 73a may be equal to the width of the second upper link 73Fa or the width CLW of the first upper link 73Ca.

Referring to FIG. 20, in the case that one side of the first upper link 73Ca is not extended toward the second upper link 73Fa, the first upper link 73Ca and the second upper link 73Fa may be spaced a certain distance LD apart from each other as the first upper link 73Ca is moved from the first state to the second state, as illustrated in FIG. 20(a). The distance LD between the first upper link 73Ca and the second upper link 73Fa may increase when moving from the first state toward the second state.

The problem with this is that the user's hand may get hurt by getting caught between the first upper link 73Ca and the second upper link 73Fa during the transition from the first state to the second state.

In contrast, as illustrated in FIG. 20(b), in the case that one side of the first upper link 73Ca is extended toward, and overlapping with the second upper link 73Fa, the space between the first upper link 73Ca and the second upper link 73Fa may not be exposed even when the first upper link 73Ca is moved from the first state to the second state. This can avoid the risk of the user's hand getting caught between the first upper link 73Ca and the second upper link 73Fa during the transition from the first state to the second state.

Figure 21:
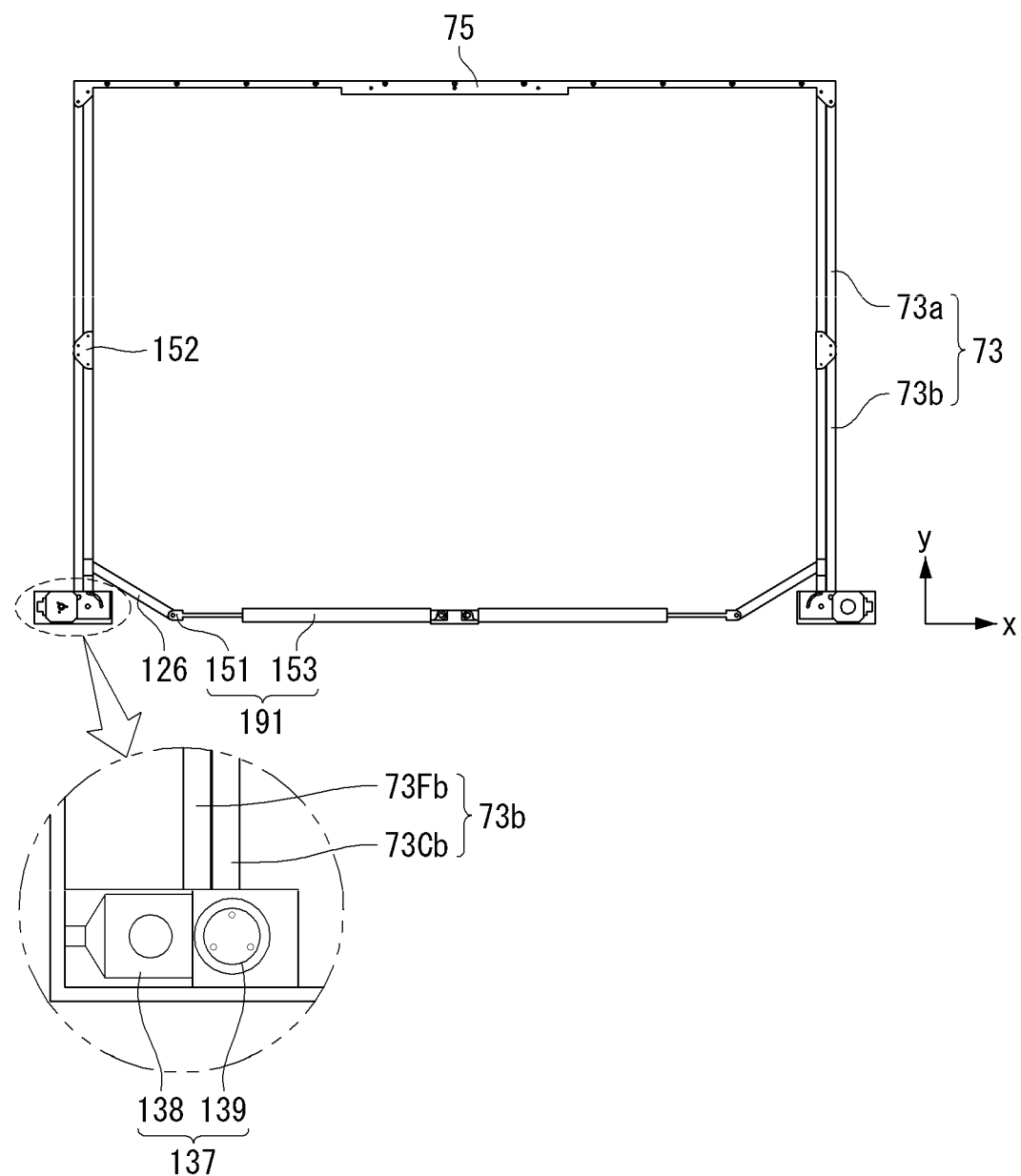

Referring to FIG. 21, the motor assembly 137 may include a motor 138 and a decelerator 139.

The motor 138 may take electricity and convert them into physical force. The motor may transmit rotational energy to the decelerator 139. There may be two motors 138 which may be fixed to the bottom of either side of the housing 30.

The decelerator 139 may be shaped to interlock with the motor 138. The decelerator 139 may be covered in a different casing from the motor 138. With the decelerator 139 being covered in a different casing from the motor 138, unnecessary contact between them may be avoided. However, the decelerator 139 is not limited to such a configuration, but may be covered in the same casing as the motor 138.

The decelerator 139 may rotate in the first direction when the motor 138 rotates in the first direction, and rotate in the second direction when the motor 138 rotates in the second direction. The decelerator 139 may transmit a large amount of rotational energy while lowering the rotation speed of the motor 138.

When the decelerator 139 rotates in the first direction, the angle from the ground to the lower link 73b connected to the decelerator 139 may increase. When the decelerator 139 rotates in the second direction, the angle from the ground to the lower link 73b connected to the decelerator 139 may decrease.

Figure 22:
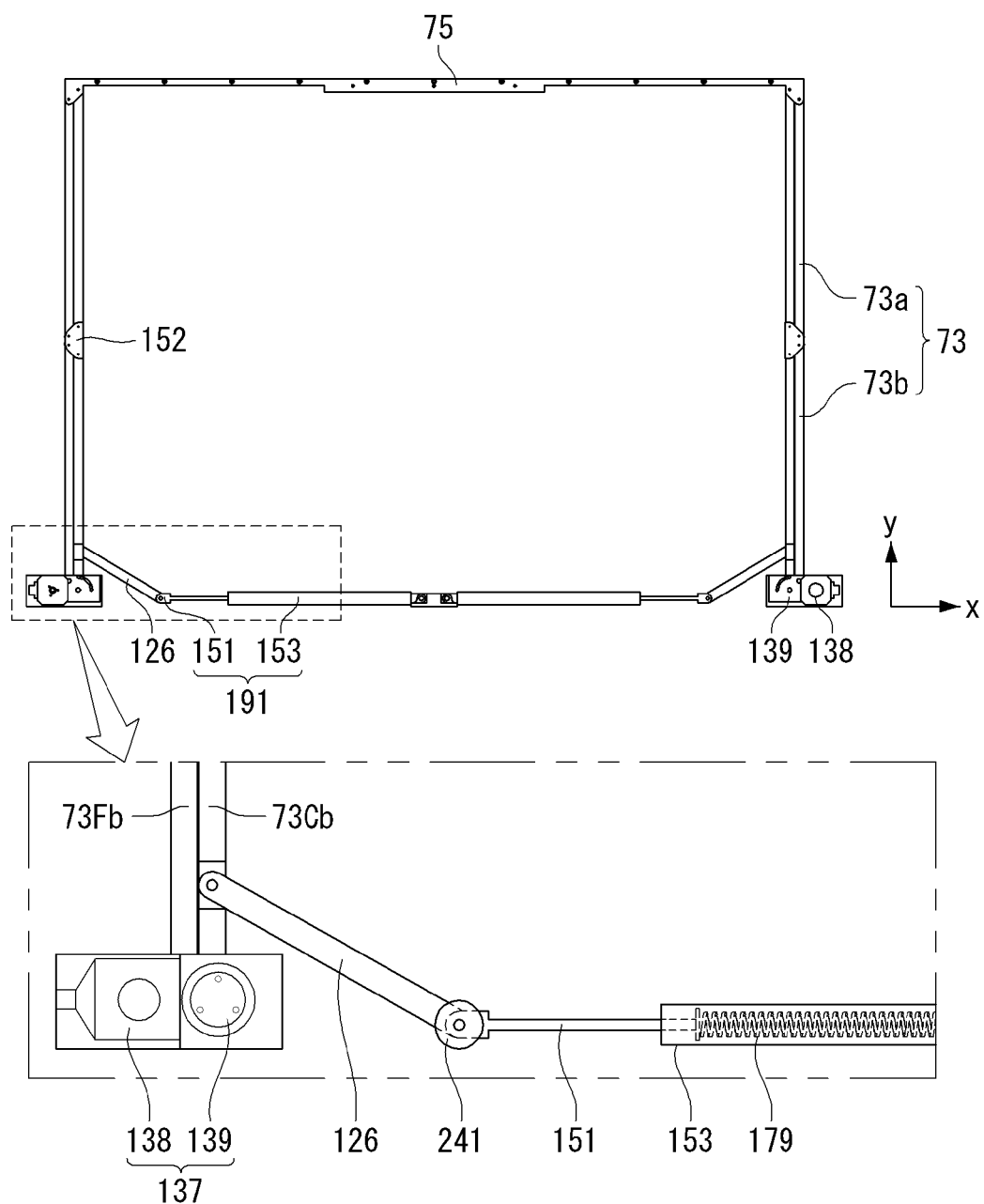

Referring to FIG. 22, in the display device according to an embodiment of the present invention, the lower link 73b may be pushed using a transmission portion 126 connected to an auxiliary link 191. The auxiliary link 191 may include a fastening portion 151, a cylindrical portion 153, and a spring portion 179.

One end of the transmission portion 126 may be connected to a lower part of the first lower link 73Cb and push the first lower link 73Cb. The transmission portion 126 may transmit energy from the auxiliary link 191 to the first lower link 73Cb. The other end of the transmission portion 126 may be connected to the fastening portion 151 of the auxiliary link 191.

A guide wheel 241 may be positioned at the joint of the transmission portion 126 and the auxiliary link 191. The guide wheel 241 may guide the transmission portion 126 and the auxiliary link 191 during the transition from the first state to the second state in such a way that they do not deviate in the third direction. Since the guide wheel 241 guides the transmission portion 126 and the auxiliary link 191 in this way, the force of the auxiliary link 191 may be correctly transmitted to the first lower link 73Cb.

The fastening portion 151 may be a portion that attaches the auxiliary link 191 and the transmission portion 126 together. The fastening portion 151 may transmit elastic force to the transmission portion 126.

The spring portion 179 may push the fastening portion 151. The spring portion 179 may be compressed when the lower link 73b descends, and stretched when the lower link 73b ascends. Thus, the spring portion 179 may exert force using its elasticity when the lower link 73b ascends.

Without the spring portion 179, the lower link 73b receives force only from the motor 138. If the angle from the ground to the lower link 73b is close to 0°, a considerable amount of torque may be needed. Thus, the motor 138 will require quite a large amount of force. This will require the motor 138 to be large in size, and also will require a large housing size.

On the other hand, with the spring portion 179, much less torque may be required to make the lower link 73b ascend. Thus, the force required for the motor 138 may be reduced to a considerable extent. This can reduce the size of the motor and also the size of the housing for accommodating the motor 138. With such a reduction in the size of the housing, the display device may enable the user to immerse themselves in the display panel without distraction by the size of the housing.

The cylindrical portion 153 may shield at least part of the fastening portion 151 and the spring portion 179. Accordingly, the cylindrical portion 153 may exert force to the fastening portion 151 without deviating when the spring portion 179 is stretched due to its elasticity.

In the display device according to the embodiment of the present invention, this elasticity allows the auxiliary link 191 to push the lower link 73b. Accordingly, the top bar 75 may ascend more easily.

Figure 23:
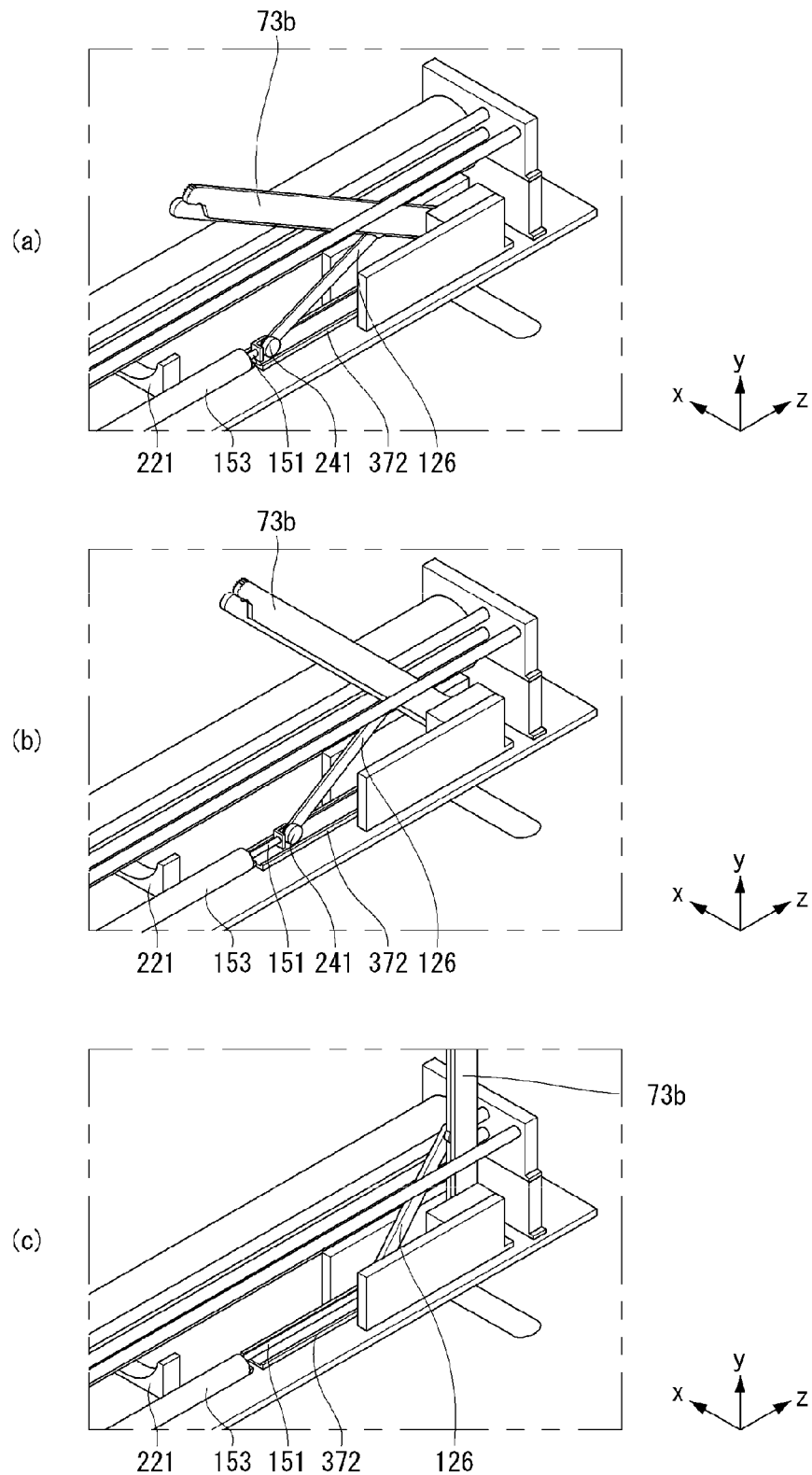

Referring to FIG. 23, the guide wheel 241 may move on a guide rail 372 during the transition from the first state to the second state. The guide rail 372 may be depressed inward in the center of the guide rail 372, and the guide wheel 241 may be inserted in the depressed part of the guide rail 372 and be movable.

As illustrated in FIG. 23(a), in the first state, most of the fastening portion 151 may be within the cylindrical portion 153. This means that the spring portion is compressed. Since the fastening portion 151 does not push the transmission portion 126, the angle from the ground to the transmission portion 126 may be small. The guide wheel 241 may be positioned adjacent to the cylindrical portion 153, along the guide rail 372.

As illustrated in FIG. 23(b), the fastening portion 151 may be exposed out of the cylindrical portion 153 during the transition from the first state to the second state. That is, the fastening portion 151 may push the transmission portion 126. In this case, the spring portion may deliver elastic energy as it is uncompressed. Since the fastening portion 151 pushes the transmission portion 126, the angle from the ground to the transmission portion 126 may increase gradually. The guide wheel 241 may be positioned midway along the guide rail 372.

As illustrated in FIG. 23(c), in the second state, most of the fastening portion 151 may be exposed out of the cylindrical portion 153. This means that the spring portion is fully uncompressed. Since the fastening portion 151 pushes the transmission portion 126, the angle from the ground to the transmission portion 126 may be large. The guide wheel 241 may be positioned adjacent to the lower link 73b, along the guide rail 372.

In the display device according to the embodiment of present invention, the guide wheel 241 may push the lower link 73b while moving along the guide rail 372. Accordingly, the elasticity of the spring portion may be transmitted more easily and correctly.

Figure 24:
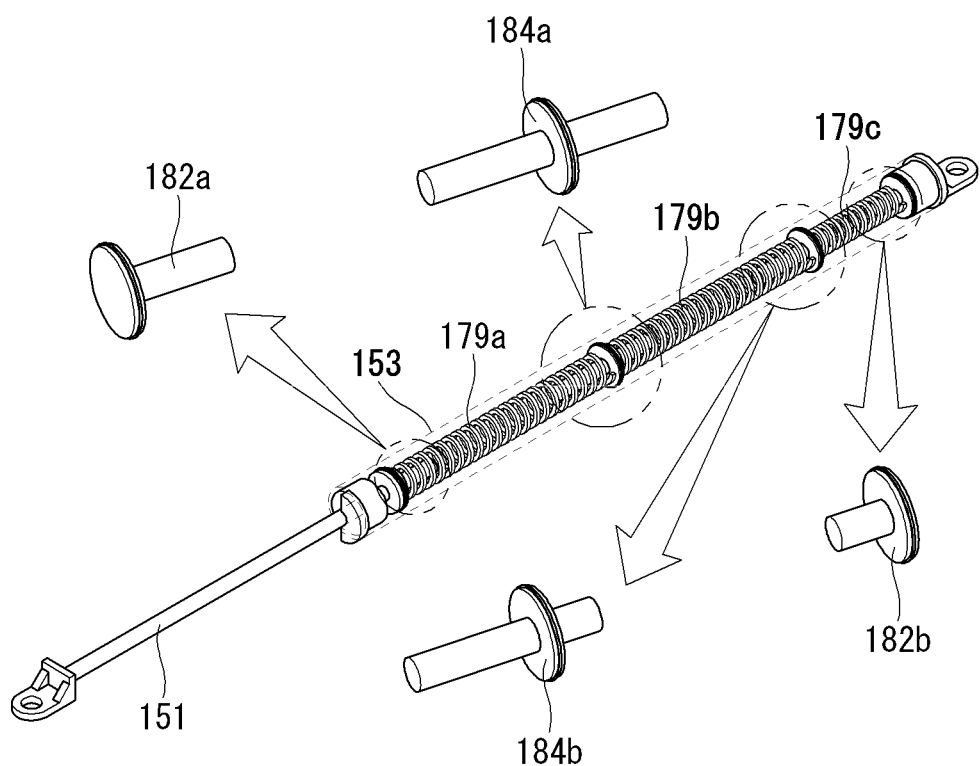

Referring to FIG. 24, the spring portion 179 may include first to third springs 179a to 179c. The first spring 179a may be more adjacent to the fastening portion 151 than the second and third springs 179b and 179c. Also, the second spring 179b may be more adjacent to the fastening portion 151 than the third spring 179c. That is, the third spring 179c may be the farthest spring from the fastening portion 151. Accordingly, the third spring 179c may be the farthest spring from the transmission portion connected to the fastening portion 151.

At least one of the first to third springs 179a to 179c may have a different spring constant. For example, the third spring 179c may have a higher spring constant than the first and second springs 179a and 179b. That is, the third spring 179c requires more force to deform than the first and second springs 179a and 179b. The first to third springs may be separated from one another by side supporters 182 and main supporters 184.

The side supporters 182 may include first and second side supporters 182a and 182b. The first side supporter 182a may be positioned on one end of the first spring 179a, and the second side supporter 182b may be positioned on the other end of the third spring 179c. Protrusions of the first and second side supporters 182a and 182b may be inserted into the first and third springs 179a and 179c.

The main supporters 184 may include first and second main supporters 184a and 184b. The first main supporters 184a may be positioned between the first spring 179a and the second spring 179b.

The first and second main supporters 184a and 184b may protrude on both sides. Protrusions of the first main supporter 184a may be attached to the other end of the first spring 179a and one end of the second spring 179b. Also, protrusions of the second main supporter 184b may be inserted into the other end of the second spring 179b and one end of the third spring 179c.

The range of displacement of the first to third springs 179a to 179c may be limited due to the side supporters 182 and the main supporters 184. That is, the amount of compression of the first to third springs 179a to 179c may be limited due to the side supporters 182 and the main supporters 184.

In the display device according to the embodiment of the present invention, the spring portion 179 may comprise of a plurality of springs with different spring constants. Accordingly, the force the spring portion 179 exerts may be balanced with the non-linear force needed for the supports to ascend or descend.

Figure 25:
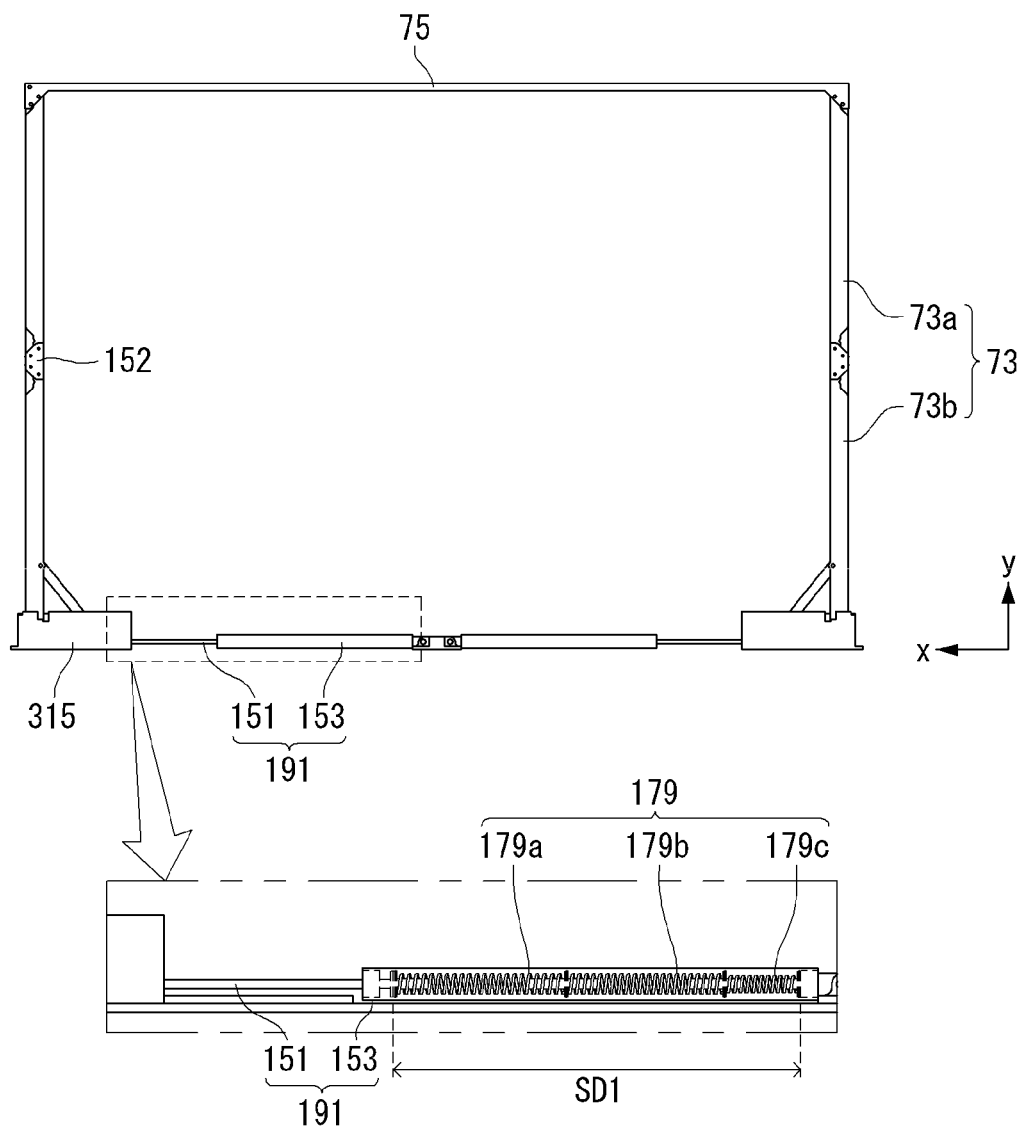
Figure 26:
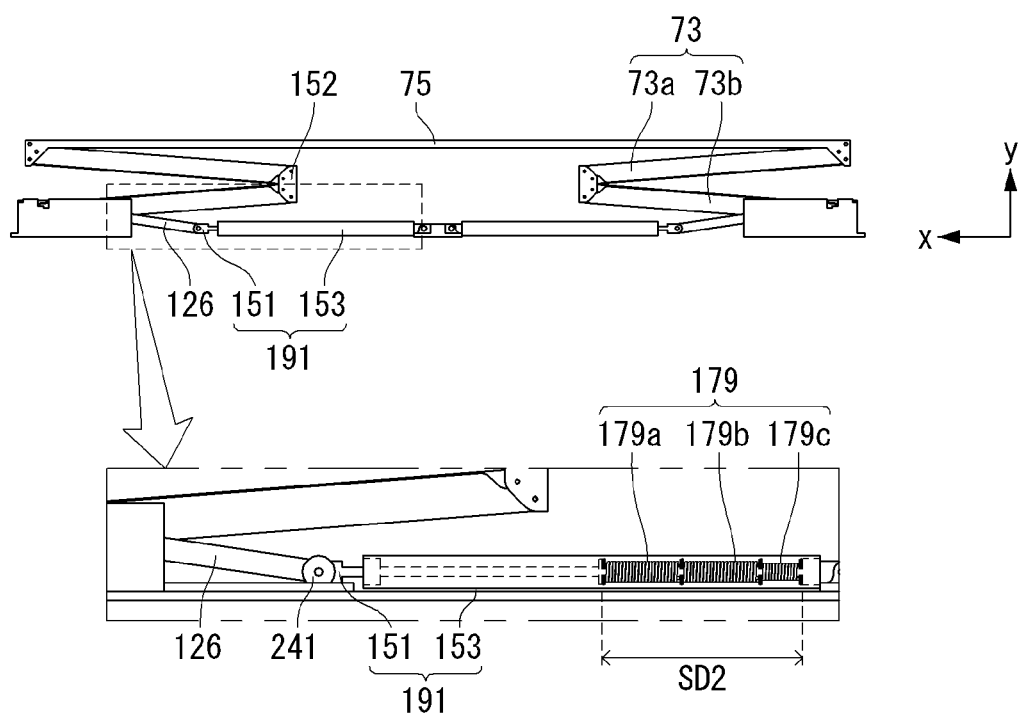

Referring to FIGS. 25 and 26, in the second state, the spring portion 179 may be in an uncompressed state. Accordingly, the spring portion 179 may have a first length SD1. The first length SD1 may be the maximum length when the spring portion 179 is fully uncompressed. The uncompressed spring portion 179 may transmit force to the supports 73 by pushing on the fastening portion 151.

During the transition from the second state to the first state, the angle from the ground to the lower link 73b may decrease, pushing the transmission portion 126 toward the center. Accordingly, the force is transmitted to the fastening portion 151, allowing the fastening portion 151 to compress the spring portion 179. The spring portion 179 may have a second length SD2, which is shorter than the first length SD1 the spring portion 179 had in the second state.

In the second state, the spring portion 179 may not be exposed out of the cylindrical portion 153. That is, the spring portion 179 may not be exposed out of the cylindrical portion 153 in any circumstances. Since the spring portion 179 is not exposed out of the cylindrical portion 153, it may push the lower link 73b without deviating from the cylindrical portion 153. Also, since the spring portion 179 is not exposed out of the cylindrical portion 153, its elasticity is not scattered and the user will find the look of the display device tidy.

Figure 27:
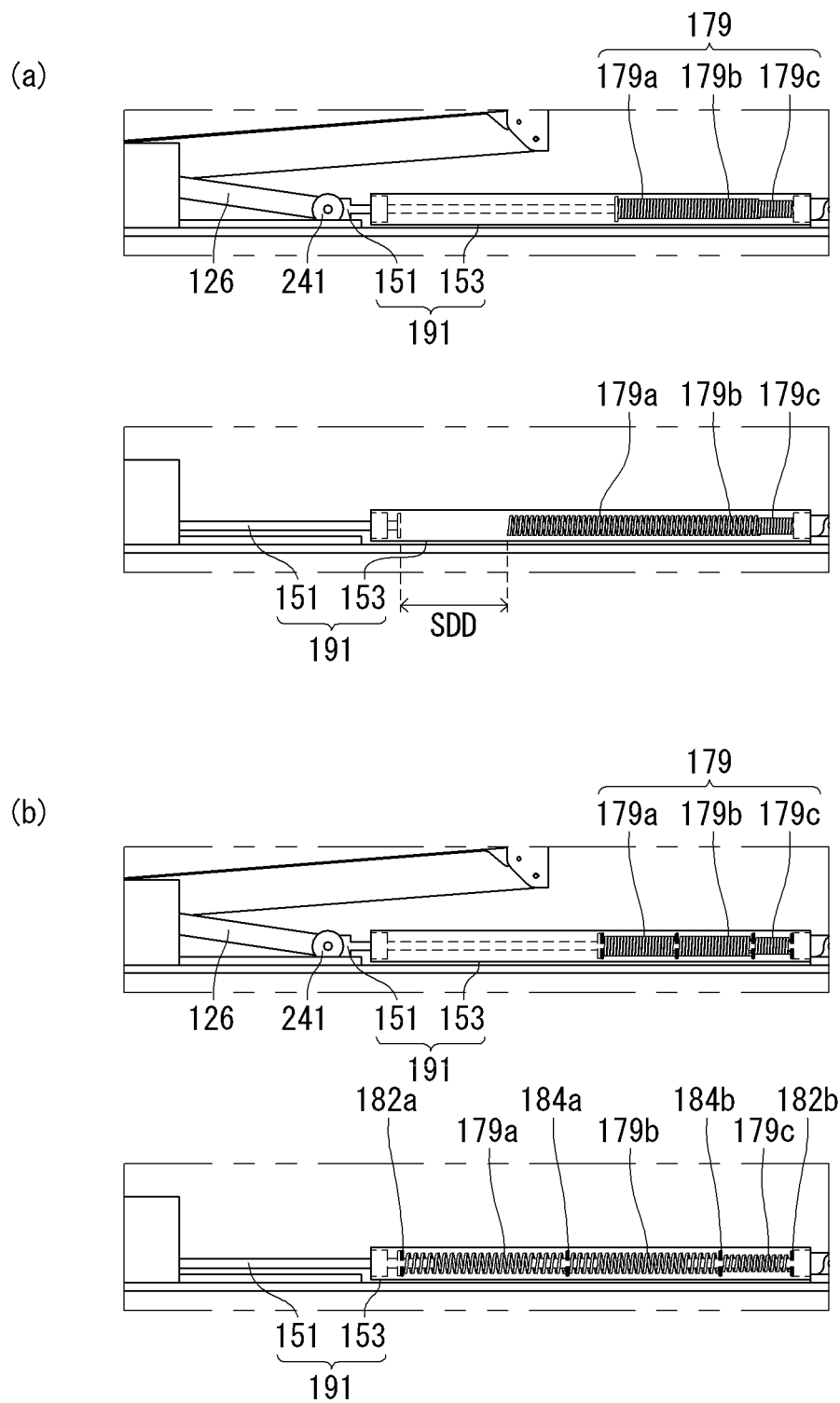

Referring to FIG. 27, if the side supporters 182 and the main supporters 184 are not provided among the first to third springs 179a to 179c, as illustrated in FIG. 27(a), the first and second springs 179a and 179b with a lower spring constant may be excessively compressed in the first state. In contrast, the amount of compression of the third spring 179c with a higher spring constant may be relatively small in the first state, compared to the first and second springs 179a and 179b.

In this case, the first and second springs 179a and 179b may suffer plastic deformation due to the excessive compression. Also, the amount of compression of the third spring 179c may be relatively small. Due to the plastic deformation of the first and second springs 179a and 179b, the first and second springs 179a and 179b may not be restored to their original length during the transition from the first state to the second state. That is, the length of the first and second springs 179a and 179b may be shorter than that before the plastic deformation by a certain distance SDD. Accordingly, the spring portion 179 does not push on the fastening portion 151 and therefore the lower link 73b may not ascend.

On the other hand, as illustrated in FIG. 27(b), when the side supporters 182 and the main supporters 184 are provided among the first to third springs 179a to 17c, the amount of compression of the first to third springs 179a to 179c in the first state may be limited due to the side supporters 182 and the main supporters 184. That is, the first and second springs 179a and 179b may be compressed no more than a certain length. Thus, the first and second springs 179a and 179b may not suffer physical deformation even when they are compressed. Also, the compression force may not be concentrated on the first and second springs 179a and 179b. Accordingly, the length of the spring portion 179 may be longer if the side supporters 182 and the main supporters 184 are provided.

The first and second springs 179a and 179b may not suffer plastic deformation because of the side supporters 182 and the main supporters 184. Thus, the first and second springs 179a and 179b may return to their original length after the transition from the first state to the second state. Accordingly, the spring portion 179 may properly push on the fastening portion 151, allowing the lower link 73b to ascend.

In the display device according to the embodiment of the present invention, the side supporters 182 and the main supporters 184 may be positioned among the springs. Accordingly, the spring portion 179 may not suffer plastic deformation, which makes it easy to transmit force to the lower link 73b.

Figure 28:
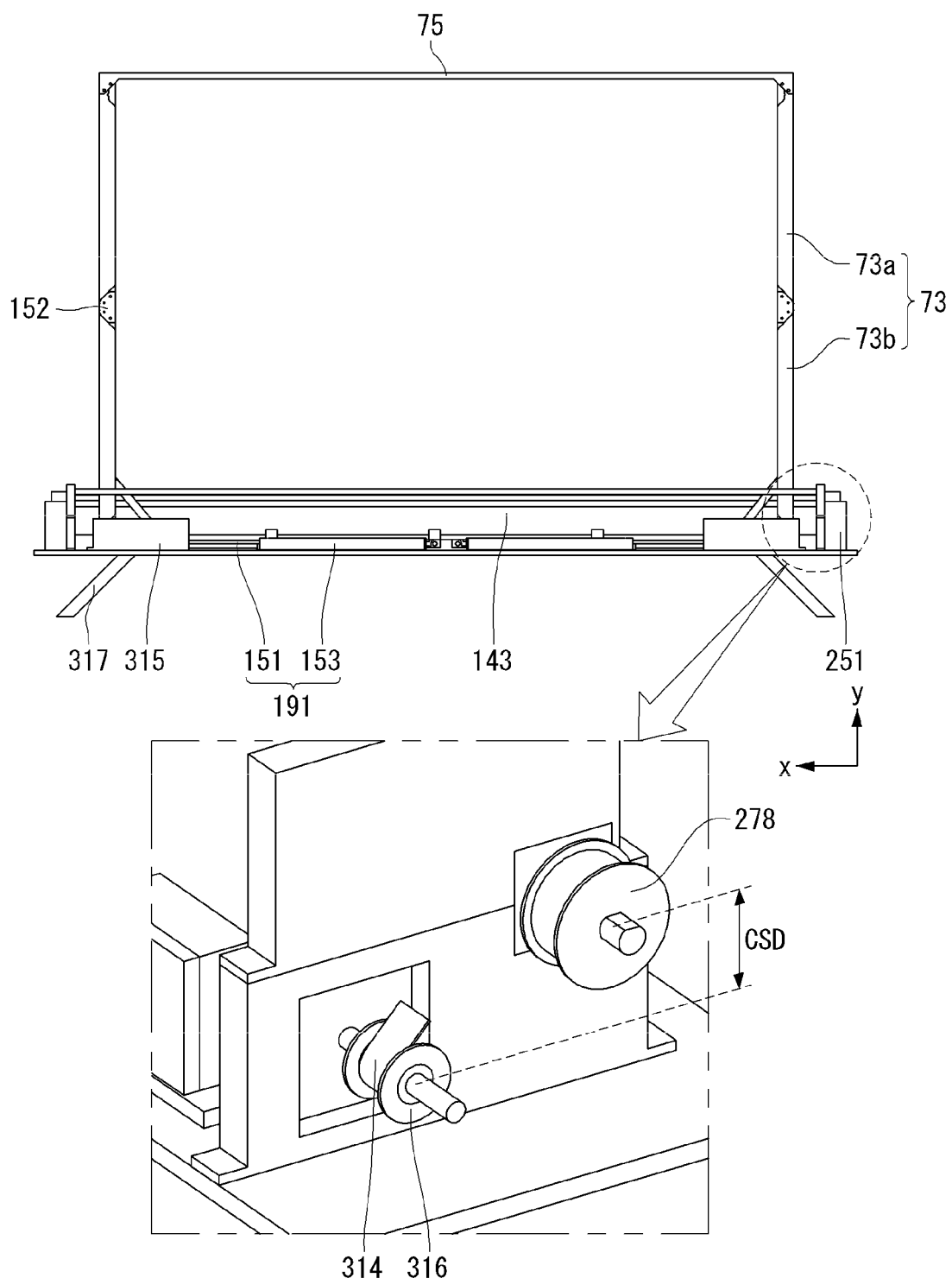

Referring to FIG. 28, in the display device according to an embodiment of the present invention, a roller hub 278 may be positioned on either side of the housing, corresponding to the panel roller 143. The roller hub 278 may be attached to the center axis of the panel roller 143. The roller hub 278 may have a wide circumference so that a transmission belt 314 to be described later may easily wound around it.

A constant spring 316 may be spaced apart from the roller hub 278. The transmission belt 314 may be wound around the constant spring 316 and the roller hub 278. The transmission belt 314 may tend to remain wound around the constant spring 316. Accordingly, if the transmission belt 314 is unwound from the constant spring 316, force may be exerted in a direction in which the transmission belt 314 is to be wound again.

The constant spring 316 may be located a first distance CSD below the roller hub 278, along the second direction. In this case, more force may be transmitted, compared to when the constant spring 316 is at the same height as or above the roller hub 278.

Referring to FIG. 29, a first torque T1 may be applied to the panel roller 143 to wind the display panel around the panel roller 143, as illustrated in FIG. 29(a). Since the first torque T1 is small, the amount of rotation of the panel roller 143 may be relatively small, compared to the length of vertical movement of the display panel 10. In this case, the display panel 10 may hang down from the panel roller 143 and thus may not be correctly wound around the panel roller 143.

As illustrated FIG. 29(b), a second torque T2 may be applied to the panel roller 143 to wind the display panel 10 around the panel roller 143. The second torque T2 may be larger than the first torque T1. Accordingly, the amount of rotation of the panel roller 143 may correspond to the length of vertical movement of the display panel 10. In this case, the display panel 10 may be correctly wound around the panel roller 143 as they interlock with each other.

In the display device according to the embodiment of the present invention, a certain amount of torque or more may be required in order that the display panel 10 is correctly around the panel roller 143 by interlocking with it. Accordingly, a device for applying the certain amount of torque or more to the panel roller 143 may be required.

Referring to FIG. 30, the roller hub 278 may rotate together with the panel roller 143 in a first direction, i.e., counterclockwise direction, during the transition from the first state to the second state, as illustrated in FIG. 30(a). The display panel 10 and the transmission belt 314 may be kept wound in opposite directions. Accordingly, as the display panel 10 and the roller hub 278 rotate in the first direction, the transmission belt 314 may be unwound from the roller hub 278 and the display panel 10 may be wound around the panel roller 143.

Because the constant spring 316 has a certain amount of torque in a clockwise direction, it may help the display panel 10 rotate counterclockwise when it is wound around the roller hub 278. Since the torque of the constant spring 316 helps when the roller hub 278 rolls, it may help also when the panel roller 143 connected to the roller hub 278 rolls. Accordingly, the display panel 10 may be correctly wound around the panel roller 143 by interlocking with it.

In contrast, as illustrated in FIG. 30(b), the roller hub 278 may rotate together with the panel roller 143 in a second direction, which is the opposite direction to the first direction, during the transition from the first state to the second state. The display panel 10 and the transmission belt 314 may be kept wound in opposite directions. Accordingly, as the display panel 10 and the roller hub 278 rotate in the second direction, the transmission belt 314 may be wound around the roller hub 278 and the display panel 10 may be unwound from the panel roller 143.

Because the constant spring 316 has a certain amount of torque in a clockwise direction, it may obstruct the display panel 10 from rotating clockwise when unwound from the roller hub 278. Accordingly, the force required for the display panel 10 to ascend by means of the supports should be larger than the torque of the constant spring 316, in order for the constant spring 316 not to obstruct the panel roller 143 and the roller hub 278 from rotating in the second direction.

In the display device according to the embodiment of the present invention, when the panel roller 143 and the roller hub 278 rotate in the second direction, the display panel 10 may be wound fast by the torque of the constant spring 316. This may prevent the display panel 10 from hanging down from the panel roller 143.

Figure 31:
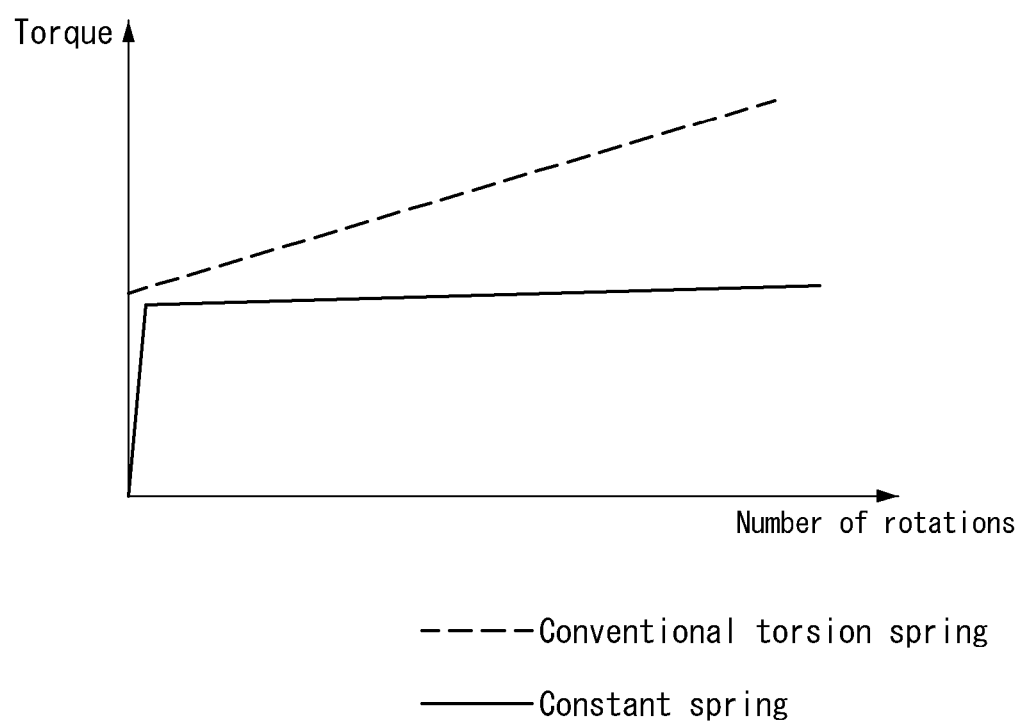

Referring to FIG. 31, the torque of a conventional torsion spring versus the number of rotations of the roller hub is indicated with a dotted line, and the torque of the constant spring versus the number of rotations of the roller hub is indicated with a solid line.

The amount of change in the torque required to wind the display panel around the panel roller may be small depending on the number of rotations.

As indicated with the dotted line, the greater the number of rotations, the larger the torque applied to the conventional torsion spring. Accordingly, unnecessary torque may be produced. This may require mechanisms for reducing unnecessary torque, and the addition of these mechanisms may increase noise.

On the other hand, as indicated with the solid line, the torque applied to the constant spring may be constant if the number of rotations exceeds a certain value. Accordingly, unnecessary torque may be minimized, and this may lead to less noise and minimum installation space.

FIGS. 32 to 43 are views showing a display device according to another exemplary embodiment of the present invention.

Figure 32:
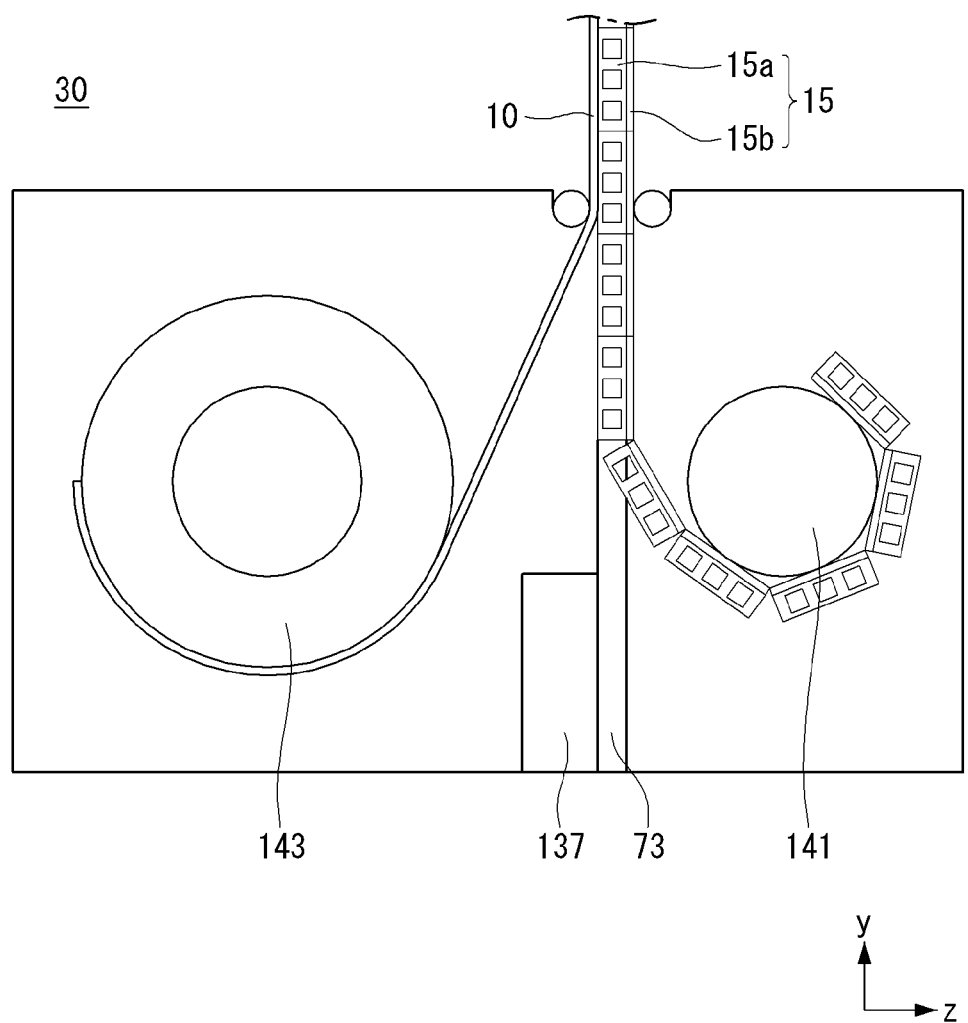

Referring to FIG. 32, in the display device according to an embodiment of the present invention, the panel roller 143 may be positioned in front of the supports 73, and an apron roller 141 may be positioned behind the supports 73. That is, the panel roller 143 and the apron roller 141 may face each other on opposite sides of the supports 73.

The panel roller 143 may wind or unwind the display panel 10, and the apron roller 141 may wind or unwind the module cover 15. The display panel 10 and the module cover 15 may not be attached with an adhesion layer because they are wound around different rollers.

The module cover 15 may be thicker than the display panel 10, so it may take up a lot of space in the housing 30. Accordingly, the motor assemblies 137 may be positioned in front of the supports 73 so as to not obstruct the winding or unwinding of the module cover 15. However, the motor assemblies 137 are not limited to such a configuration, but may be positioned behind the supports 73.

As the display panel 10 and the module cover 15 are separately wound within the housing 30, the winding force of the panel roller 143 and apron roller 141 may be greater than the attachment force of the display panel 10 and module cover 15.

In the embodiment of the present invention, the display panel 10 and the module cover 15 may be wound by two rollers, respectively. Accordingly, the weight of windings may be shared between the two rollers, and this may prevent the display panel 10 and the module cover 15 from hanging down during winding.

Figure 33:
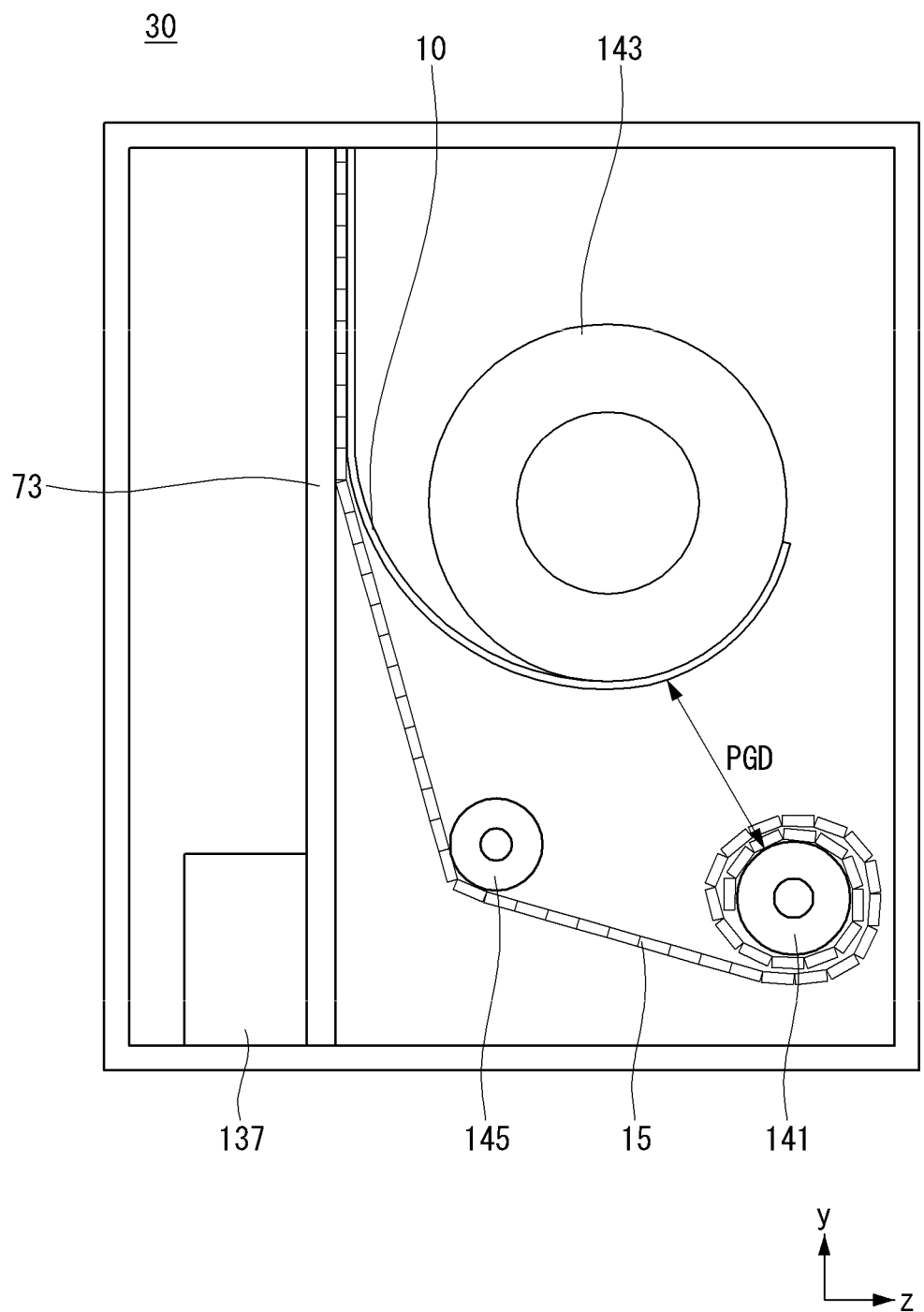

Referring to FIG. 33, in the display device according to an embodiment of the present invention, the panel roller 143 and the apron roller 141 may be positioned on the same side. For example, the panel roller 143 and the apron roller 141 may be positioned behind the supports 73. However, the panel roller 143 and the apron roller 141 are not limited to such a configuration, but may be positioned in front of the supports 73.

The apron roller 141 may be positioned below the panel roller 143. Since the module cover 15 has a large thickness, the diameter of the apron roller 141 may increase quite a lot during the transition from the second state to the first state. Accordingly, the apron roller 141 may be spaced a first distance PGD or longer apart from the panel roller 143 to avoid contact with the panel roller 143. The distance PGD may be equal to or greater than the distance at which the apron roller 141, in the first state, does not make contact with the panel roller 143.

A guide roller 145 may be positioned in a line along which the apron roller 141 unrolls. The guide roller 145 may guide the module cover 15 in such a way that the module cover 15 does not make contact with the panel roller 143 when the module cover 15 is in at least one of the first and second states. The guide roller 145 may be positioned below the panel roller 143 so that the module cover 15 does not make contact with the panel roller 143.

In the display device according to the embodiment of the present invention, the panel roller 143 and the apron roller 141 may be positioned one above the other on the same side. This may save more space compared to when the panel roller 143 and the apron roller 141 are on different sides.

Figure 34:
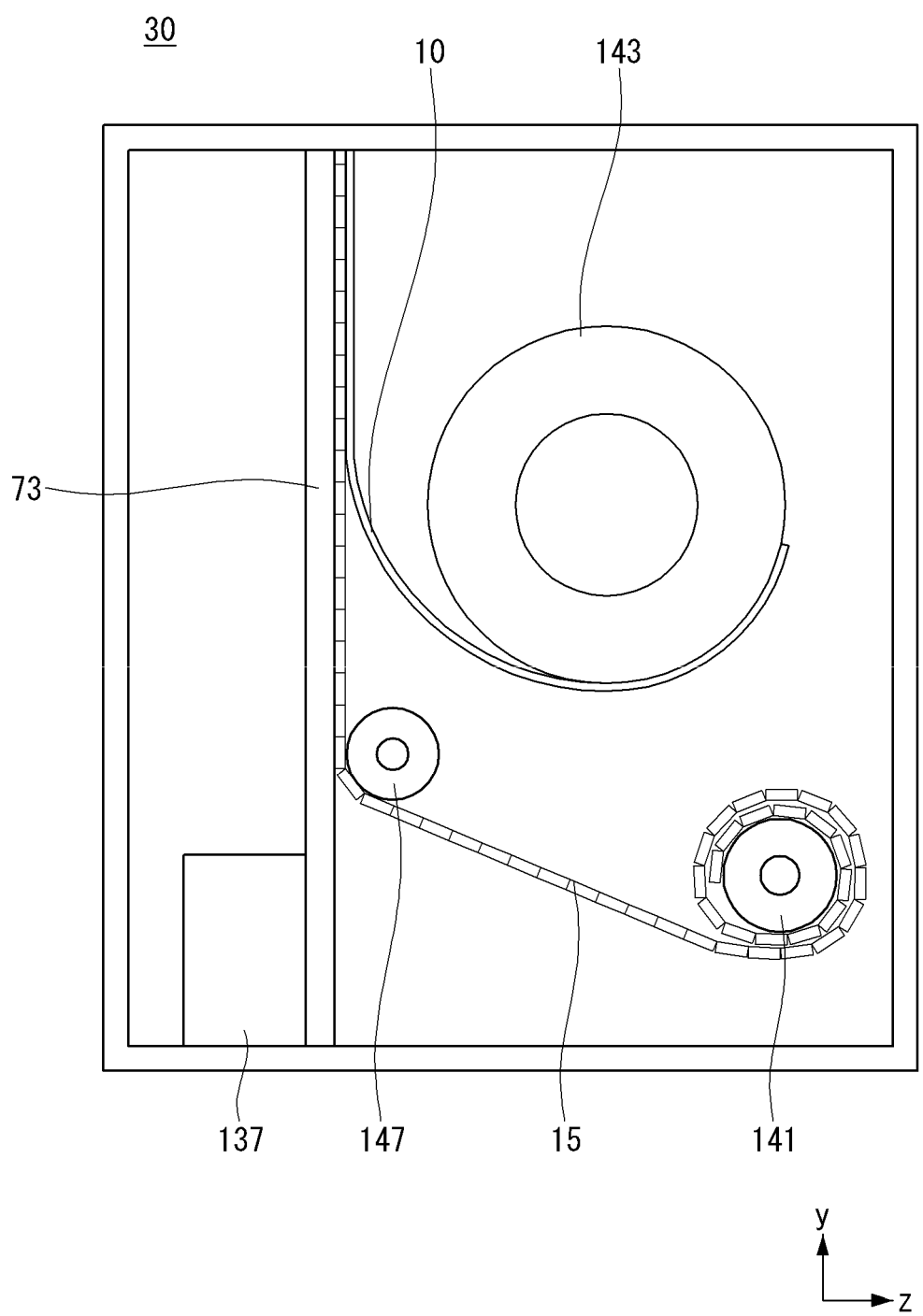

Referring to FIG. 34, in the display device according to the embodiment of the present invention, a pressure roller 147, instead of the guide roller, may be provided. The pressure roller 147 may press the module cover 1 into contact with the supports 73. Accordingly, the module cover 15 may remain flat without being bent. The pressure roller 147 may be positioned adjacent to the supports 73 in a third direction so that the module cover 15 makes contact with the supports 73. The pressure roller 147 may function to guide the module cover 15 so that the module cover 15 and the panel roller 143 make contact with each other.

In the display device according to the embodiment of the present invention, the pressure roller 147 may press the module cover 15 into contact with the supports 73. Accordingly, the display panel 10 may become flat, allowing the user to immerse themselves in the display panel 10.

Figure 35:
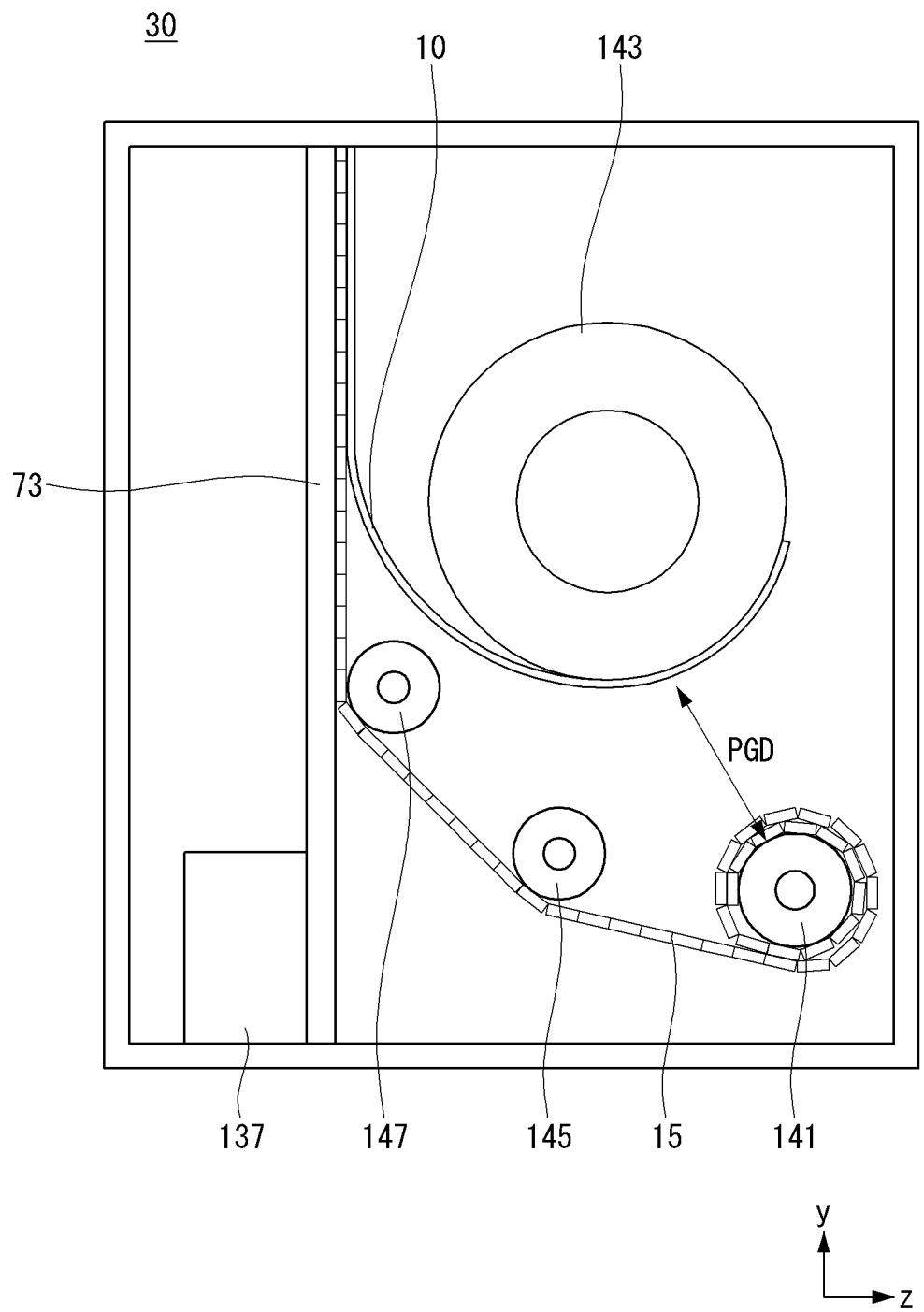

Referring to FIG. 35, in the display device according to an embodiment of the present invention, both the guide roller 145 and the pressure roller 147 may be provided. Thus, the module cover 15 may be kept from making contact with the panel roller 143, but may come into contact with the supports 73. This may result in fewer malfunctions in the display device, and the user may enjoy watching on the flat surface of the display panel 10.

Referring to FIG. 36, in the display device according to an embodiment of the present invention, the module cover 15 may include a plurality of sections such as a first to fourth module cover sections 15a to 15d.

The first module cover section 15a may be positioned in the center of the module cover 15. The first module cover section 15a may be attached to the top bar 75. An exemplary method of attaching the first module cover section 15a will be described later. The third module cover section 15c may be positioned on either side of the module cover 15. That is, the third module cover section 15c may be positioned on each side of the module cover 15.

The fourth module cover section 15d may be positioned on the top side of the module cover 15. The fourth module cover section 15d may be connected to the upper part of the third module cover section 15c. In the second state, the fourth module cover section 15d and the third module cover section 15c may be positioned on the rear edge of the display panel. The fourth module cover section 15d may be attached to the top bar 75. For example, the fourth module cover section 15d may have a shape that covers the top bar 75 in the rear. An exemplary method of attaching the fourth module cover section 15d may be described later.

The second module cover section 15b may be positioned further back from the first module cover section 15a and third module cover section 15c, and may be attached to the first and third module cover sections 15a and 15c. The center of the second module cover section 15b may be attached to the first module cover section 15a, and both sides of the second module cover section 15b may be attached to the third module cover section 15c.

The first module cover section 15a and the third module cover section 15c may be spaced apart from each other. Also, the front of the first module cover section 15a may protrude a certain distance LMD from the front of the second module cover section 15b. That is, the first module cover section 15a and the third module cover section 15c may have space in between. The supports 73 may be positioned in the space between the first module cover section 15a and the third module cover section 15c.

Although not shown, the display panel 10 may be attached to the front of the module cover 15. Accordingly, the supports 73 may be shielded by the display panel 10 in the front and by the second module cover section 15b in the rear. The user may immerse themselves in the display screen because the operation of the supports 73 is out of their view, and will find the look of the display device tidy.

Referring to FIG. 37, without the first module cover section 15a, the display panel 10 is attached only to the third module cover section 15c on both sides, as illustrated in FIG. 37(a). Thus, the display panel 10 may be depressed in the center, because of a space between the second module cover section 15b and the display panel 10.

Accordingly, the user may not be able to immerse themselves in the display screen because of the non-flatness of the surface of the display panel 10. Also, the depression may lead to damage to the display panel.

In contrast, in the display device according to the embodiment of the present invention, the first module cover section 15a may be positioned in the center, as illustrated in FIG. 37(b). The display panel 10 may be attached to the third module cover section 15c on both sides, and its center may be attached to the first module cover section 15a. The first module cover section 15a will occupy a space between the display panel 10 and the second module cover section 15b. As such, the display 10 may remain flat. Accordingly, the user can immerse themselves in the display screen.

Figure 38:
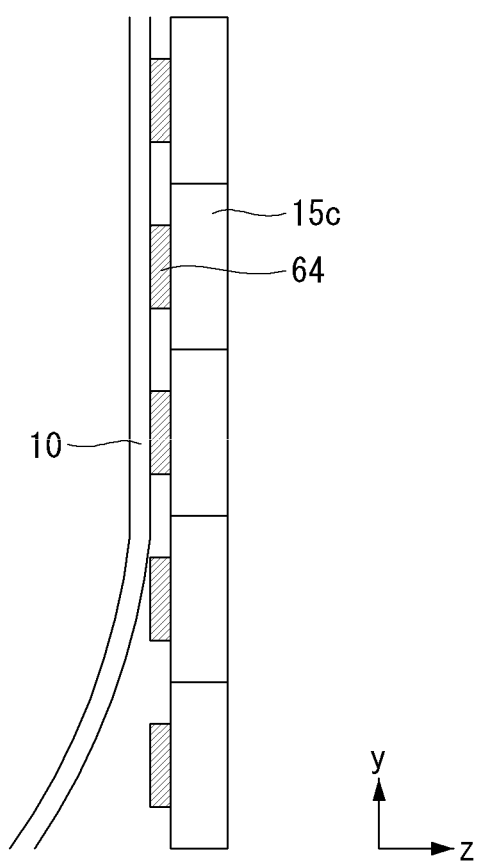

Referring to FIG. 38, in the display device according to an embodiment of the present invention, the third module cover section 15c positioned on both sides of the module cover may be attached to the display panel 10.

The third module cover section 15c and the display panel 10 may be held together by magnets 64 positioned on at least one apron. The magnets 64 may be attached to the apron with double-sided tape. The magnets 64 may be spaced apart from one another. Thus, their shape may be easily deformed when the module cover 15 is wound by the roller or unwound from it.

The display panel 10 may be attached to the magnets 64. The surface of the display panel 10 that makes contact with the magnets 64 may include a Fe—Ni Invar alloy. Accordingly, the display panel 10 may be firmly attached to the magnets 64. It should be noted that the surface of the display panel that makes contact with the magnets 64 could be a metallic material that attaches to a magnet.

Since the display panel 10 and the module cover are attached by the magnets 64, which are positioned only on both sides of the module cover 15, only a small number of magnets 64 are required. This will save manufacturing costs.

Figure 39:
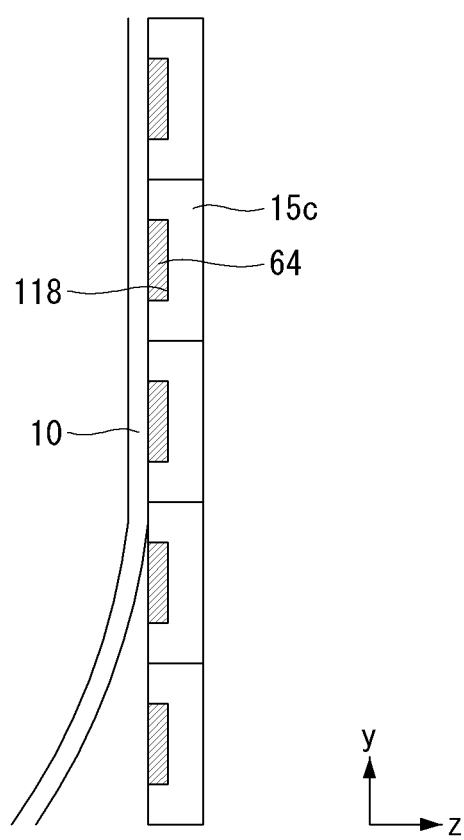

Referring to FIG. 39, in the display device according to an embodiment of the present invention, the magnets 64 may be positioned in recesses 118 of the third module cover section 15c.

The recesses 118 may be positioned on the side of the display panel 10 facing the third module cover section 15c. The recesses 118 may be positioned in the respective aprons. Since the magnets 64 are positioned in the recesses 118, the surfaces of the aprons that are in contact with the display panel 10 may be flat. Accordingly, the display device may be made thinner, and therefore have a tidy look.

Figure 40:
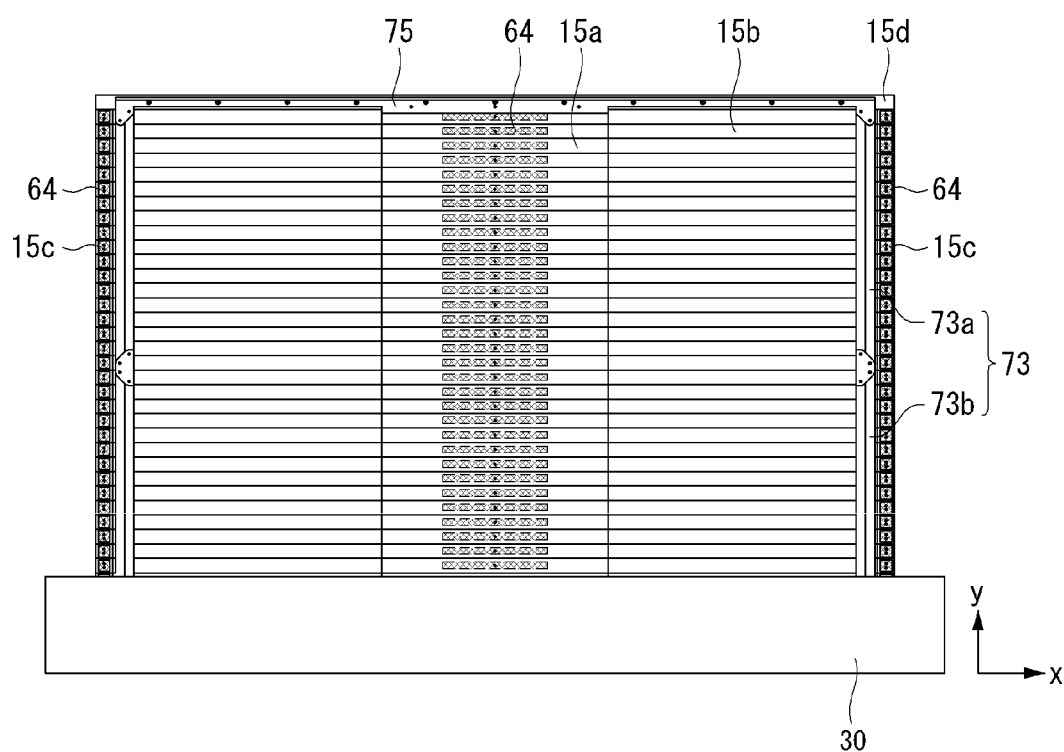

Referring to FIG. 40, in the display device according to an embodiment of the present invention, the magnets 64 may be positioned on the first module cover section 15a as well as on the third module cover section 15c. However, the magnets 64 are not limited to such a configuration, but may be positioned in recesses provided in the first module cover section 15a.

In this case, the module cover 15 and the display panel 10 may be held together more firmly, compared to when the magnets 64 are positioned only on the third module cover section 15c. Accordingly, the display panel 10 and the module cover 15 may be kept from being easily detached from each other even when external force is applied to them.

Figure 41:
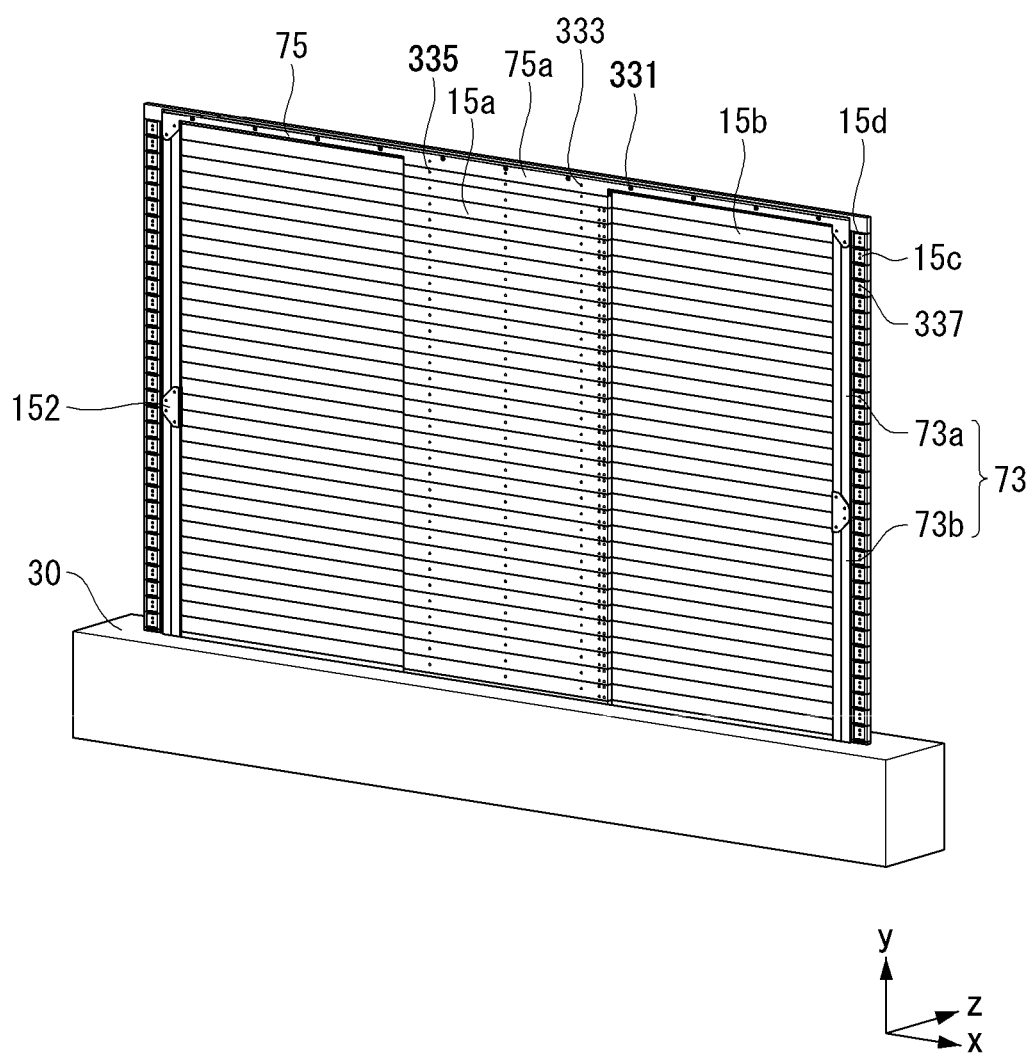

Referring to FIG. 41, in the display device according to an embodiment of the present invention, the top bar 75 and the module cover 15 may be attached, for example, with at least one screw.

The top bar 75 may be attached to the fourth module cover section 15d through first holes 331. The fourth module cover section 15d may cover the back of the top bar 75. Although not shown, the display panel 10 as well may be attached through the first holes 331.

The top bar 75 may be attached to the first module cover section 15a through second holes 333. As explained with reference to FIG. 10, a part which has a different thickness from the other part of the apron in the uppermost part of the first module cover section 15a, may be inserted into a recess in the top bar 75. The second holes 333 may be positioned lower than the first holes 331. The first module cover section 15a and the third module cover section 15c may be attached to the top bar 75 through different types of holes. Accordingly, the module cover 15 and the top bar 75 may be held together more firmly.

The first module cover section 15a and the third module cover section 15c may be attached to the second module cover section 15b in the rear, through third and fourth holes 335 and 337. The first module cover section 15a may be attached to the second module cover section 15b through the third holes 335 in the respective aprons, and the third module cover section 15c may be attached to the second module cover section 15b through the fourth holes 337 in the respective aprons.

Since the respective aprons are attached to the second module cover section 15b through the third and fourth holes 335 and 337, the first and third module cover sections 15a and 15c and the second module cover section 15b may be wound easily while being held together.

Figure 42:
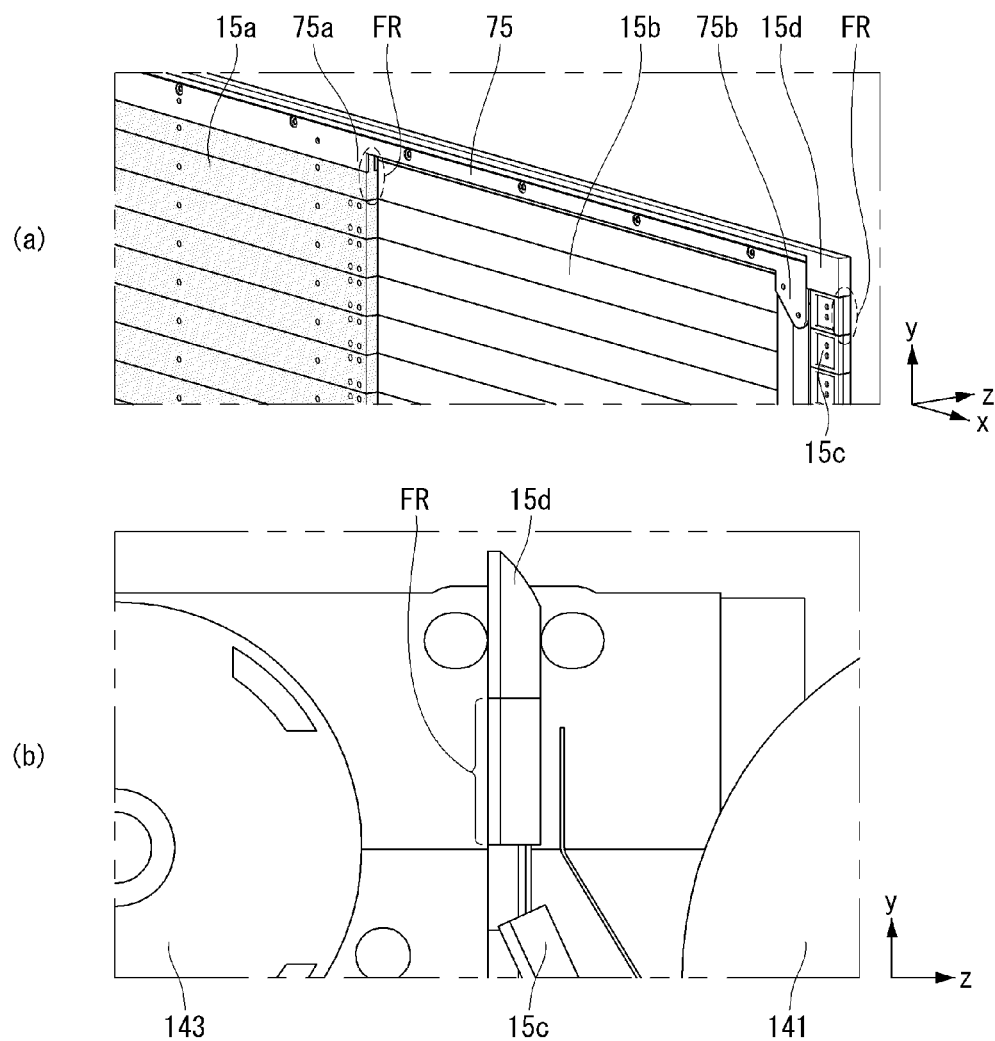

Referring to FIG. 42, the top bar 75 may include a first protrusion 75a protruding downward in the center and second protrusions 75b protruding downward on both sides.

The first protrusion 75a may be a portion in which the first module cover section 15a is inserted, and the second protrusions 75b may be portions connecting to the supports 73. The top bar 75 may not be wound because it does not comprise of multiple parts like the aprons on the module cover 15. Thus, the first protrusion 75a and the second protrusions 75b may not be wound either.

Accordingly, flat regions FR of the first and third module cover sections 15a and 15c, which correspond to the first and second protrusions 75a and 75b of the top bar 75, and the fourth module cover section 15d, which corresponds to other parts of the top bar 75, may remain flat in the first state, without being wound around the apron roller 141. For example, the uppermost apron may be positioned in the flat regions FR of the first and third module cover sections 15a and 15c.

Figure 43:
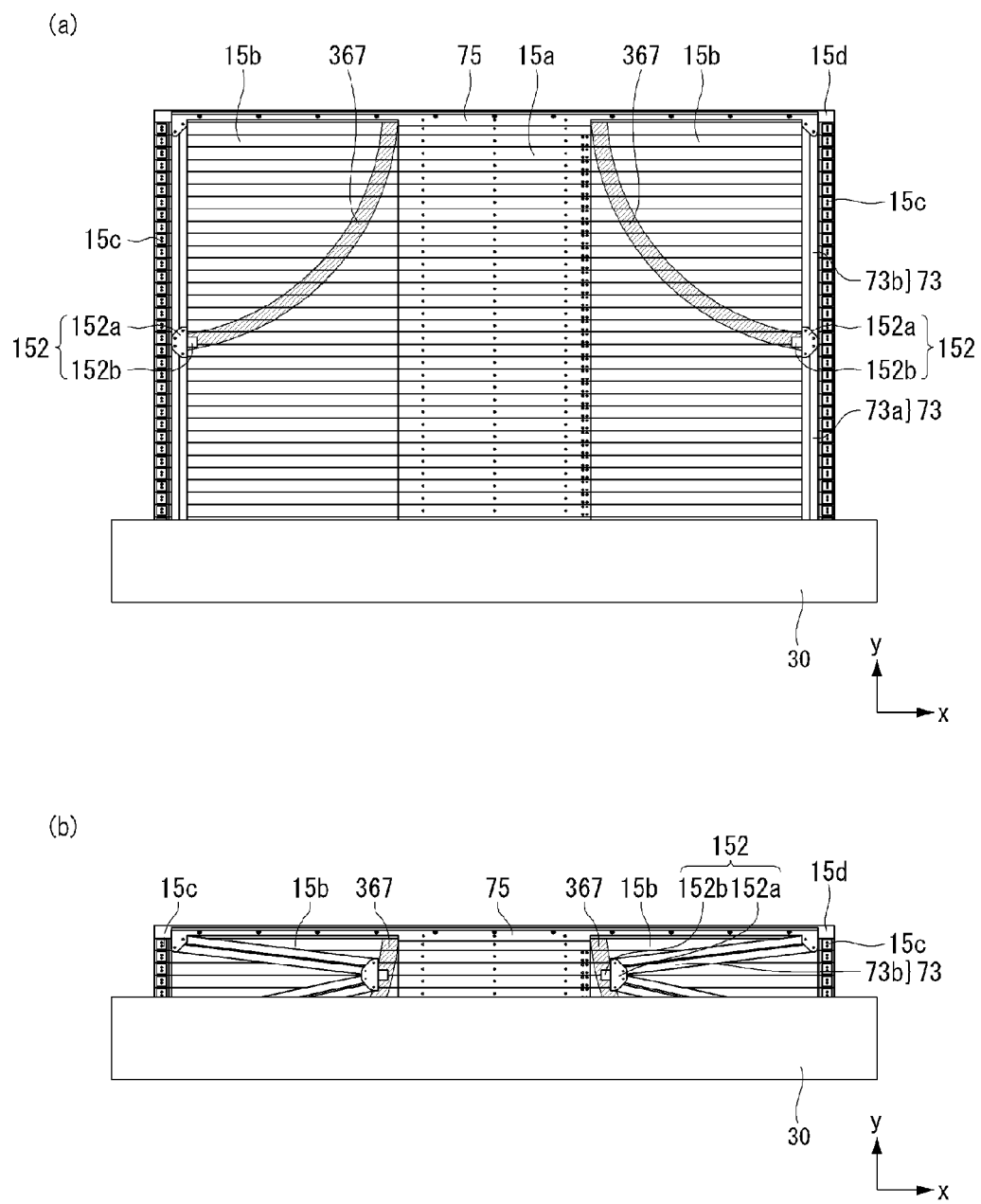

Referring to FIG. 43, in the display device according to an embodiment of the present invention, each hinge 152 may include a body 152a and an attachment part 152b.

As previously described, the body 152a may be a part that connects the upper link 73a and the lower link 73b to allow the upper link 73ab and the lower link 73b to rotate on the second module cover section 15b.

The attachment part 152b may be connected to the body 152a. The attachment part 152b may protrude toward the first module cover section 15a from the body 152a. In the first state, the attachment parts 152b may not come into contact with the first module cover section 15a. Accordingly, the supports 73 may rotate freely without being obstructed by the attachment parts 152b.

During the transition from the first state to the second state, trajectories 367 may be formed on the second module cover section 15b in which the attachment parts 152b move. The trajectories 367 may be formed on the side of the second module cover section 15b facing the display panel. The trajectories 367 may include a magnetic material. One of the trajectories 367 may be shaped like the circumference of a quadrant that extends from the center of the left side of the second module cover section 15b along the second direction to the top adjacent to the first module cover section 15a along the second direction. The other trajectory 367 may be shaped like the circumference of a quadrant that extends from the center of the right side of the second module cover section 15b along the second direction to the top adjacent to the first module cover section 15a.

The attachment parts 152b each may include a magnetic material on the side facing the second module cover section 15b. The attachment parts 152b may include a material whose polarity is opposite to that of the trajectories 167. The attachment parts 152b may move along the trajectories 167 during the transition from the second state to the first state.

Since the attachment parts 152b and the trajectories 167 include magnetic material, the hinges 152 may move while attached to the second module cover section 15b. Accordingly, the hinges 152 may not protrude forward in any circumstances, thus allowing the display panel to remain flat. Also, the trajectories 367 may guide the movement of the hinges 152. Accordingly, the protection of the display device during state transitions can be improved.

While the aforementioned drawings are illustrated in relation to a structure of a display device in which the display portion is rolled up from inside the housing, the present invention is not limited to this structure but may be applicable to a structure of a display device in which the display portion is rolled down from inside the housing.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a housing;
    a roller in the housing;
    a display portion rewindable around the roller, and the display portion comprises a flexible display panel and a module cover;
    a foldable support including a lower link pivotally connected to the housing and a upper link pivotally connected to an upper part of the display portion;
    a motor assembly installed in the housing, the motor assembly pivots the lower link of the foldable support; and
    a spring portion that provides the lower link of the foldable support with pushing force,
    wherein the spring portion comprises a plurality of springs, and the plurality of springs has different spring constants from each other.

2. The display device of claim 1, wherein a first gear is formed at an upper part of the lower link and a second gear is formed at a lower part of the upper link, and
    the first gear is engaged with the second gear.

3. The display device of claim 2, wherein the foldable support further comprises a middle link, and
    the middle link is hingedly coupled to the upper link and hingedly coupled to the lower link.

4. The display device of claim 2, wherein a first angle between a horizontal line and the upper link is substantially identical with a second angle between the horizontal line and the lower link.

5. The display device of claim 2, wherein an angle between the upper link and the lower link changes according to the motor assembly operation.

6. The display device of claim 2, further comprising
    a top bar attached to a top portion of the display portion, wherein one end of the upper link is connected to the top bar, and
    the module cover is divided into a plurality of segments, and
    a top segment of the module cover is attached to the top bar.

7. The display device of claim 1, wherein the module cover is divided into a plurality of segments.

8. The display device of claim 7, wherein the foldable support comprises an attachment part having a magnet, and
    the attachment part is in contact with the module cover.

9. The display device of claim 8, wherein the module cover comprises
    a trajectory corresponding to areas where the attachment part moves during a transition from the first state to the second state,
    where the trajectory comprises magnetic material whose polarity is opposite to that of the attachment part.

10. The display device of claim 1, wherein the display panel and the module cover can transition from a first state where the display panel and the module cover are wound around the roller to a second state where the display panel and the module cover are unwound from the roller, in contact with each other, and the upper part of the display portion moves outside of the housing from the first state to the second state.

11. The display device of claim 1, further comprising
a transmission portion, one end of which is connected to the lower link of the foldable support,
wherein the other end of the transmission portion is connected to the spring portion.

12. The display device of claim 1, further comprising
a timing control board,
wherein the timing control board disposed inside of a roller, the display panel is wound around the roller.

13. The display device of claim 12, wherein the roller comprises;
an upper panel roller portion; and
a lower panel roller portion,
wherein the timing control board is mounted in between the upper panel roller portion and the lower panel roller portion.

14. The display device of claim 12, further comprising
a source PCB attached to the display portion; and
a flat flexible cable connecting the timing control board to the source PCB,
wherein the flat flexible cable is wound around the roller.

15. The display device of claim 1, wherein the display portion is positioned between the foldable support and the roller,
wherein the display device further comprises a guide bar positioned between the roller and the display portion, the guide bar pushes the display portion from the roller to the foldable support.

16. The display device of claim 1, wherein the roller is positioned in front of the foldable support.

* * * * *